United States Patent
Park et al.

(10) Patent No.: US 12,446,347 B2
(45) Date of Patent: Oct. 14, 2025

(54) IMAGE SENSOR

(71) Applicant: SAMSUNG ELECTRONICS CO., LTD., Suwon-si (KR)

(72) Inventors: Sangchun Park, Seoul (KR); Sungbong Park, Seongnam-si (KR); Beomsuk Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 638 days.

(21) Appl. No.: 17/737,226

(22) Filed: May 5, 2022

(65) Prior Publication Data

US 2023/0054728 A1 Feb. 23, 2023

(30) Foreign Application Priority Data

Aug. 18, 2021 (KR) .................. 10-2021-0108564

(51) Int. Cl.
*H01L 21/762* (2006.01)
*H10F 39/00* (2025.01)
*H10F 39/18* (2025.01)

(52) U.S. Cl.
CPC .......... *H10F 39/807* (2025.01); *H10F 39/18* (2025.01); *H10F 39/802* (2025.01); *H10F 39/8037* (2025.01); *H10F 39/8053* (2025.01); *H10F 39/811* (2025.01)

(58) Field of Classification Search
CPC ............. H01L 27/146; H01L 27/14643; H01L 27/14363; H01L 27/14621
See application file for complete search history.

(56) References Cited

U.S. PATENT DOCUMENTS

| | | |
|---|---|---|
| 8,946,794 B2 | 2/2015 | Ahn |
| 10,868,059 B2 | 12/2020 | Jin et al. |
| 2004/0173824 A1* | 9/2004 | Nagasaki .............. H10F 39/803 257/E21.551 |
| 2006/0081887 A1 | 4/2006 | Lyu |
| 2008/0153193 A1* | 6/2008 | Lyu ....................... H10F 39/807 438/59 |
| 2011/0181747 A1* | 7/2011 | Kido ..................... H10F 39/802 348/222.1 |

(Continued)

FOREIGN PATENT DOCUMENTS

| KR | 10-2006-0034926 A | 4/2006 |
|---|---|---|
| KR | 10-2008-0019652 A | 3/2008 |

*Primary Examiner* — John A Bodnar
(74) *Attorney, Agent, or Firm* — Sughrue Mion, PLLC

(57) ABSTRACT

An image sensor includes pixels arranged parallel to an upper surface of a substrate and a pixel isolation film disposed between the pixels. Each pixel includes a floating diffusion region doped with impurities of a first conductivity type, a transfer gate structure adjacent to the floating diffusion region, and a transistor. The transfer gate structure includes a transfer gate electrode layer, a transfer gate insulating layer, and a transfer gate spacer adjacent to the transfer gate insulating layer in a first direction parallel to the upper surface of the substrate, and a portion of the transfer gate spacer is disposed between the floating diffusion region and the transfer gate electrode layer. In each pixel, a floating diffusion contact connected to the floating diffusion region is disposed more adjacent in the first direction to the pixel isolation film than to the transfer gate structure.

19 Claims, 25 Drawing Sheets

(56) References Cited

U.S. PATENT DOCUMENTS

| | | | |
|---|---|---|---|
| 2016/0133663 A1* | 5/2016 | Minowa | H10F 39/151 |
| | | | 257/229 |
| 2018/0358393 A1* | 12/2018 | Sato | H10F 39/024 |
| 2020/0212088 A1 | 7/2020 | Kwang et al. | |
| 2020/0357831 A1 | 11/2020 | Chen et al. | |
| 2021/0005647 A1 | 1/2021 | Kwang et al. | |
| 2021/0020674 A1 | 1/2021 | Woo | |

\* cited by examiner

IMAGE SENSOR

CROSS TO REFERENCE TO RELATED APPLICATION(S)

This application claims benefit of priority to Korean Patent Application No. 10-2021-0108564 filed on Aug. 18, 2021 in the Korean Intellectual Property Office, the disclosure of which is incorporated by reference herein in its entirety.

BACKGROUND

Example embodiments of the present disclosure relate to an image sensor.

An image sensor may be a semiconductor-based sensor receiving light and generating an electrical signal, and may include a pixel array having a plurality of pixels, and a logic circuit for driving the pixel array and generating an image. Each of the pixels may include a photodiode, and a pixel circuit converting electric charges generated by the photodiode into an electric signal. As the number of pixels included in the image sensor has increased and the size of each of the pixels has decreased, various methods for effectively forming devices disposed in each of the pixels and providing a pixel circuit have been suggested.

SUMMARY

It is an aspect to provide an image sensor which may, by efficiently disposing a device providing a pixel circuit in each of the pixels, increase integration density and may improve performance.

According to an aspect of one or more example embodiments, an image sensor may include a plurality of pixels arranged parallel to an upper surface of a substrate; and a pixel isolation film disposed between the plurality of pixels, wherein each of the plurality of pixels includes at least one photodiode, a floating diffusion region doped with impurities of a first conductivity type, a transfer gate structure that is disposed adjacent to the floating diffusion region, and at least one transistor, wherein the transfer gate structure includes a transfer gate electrode layer, a transfer gate insulating layer disposed between the transfer gate electrode layer and the substrate, and a transfer gate spacer adjacent to the transfer gate insulating layer in a first direction parallel to the upper surface of the substrate, and at least a portion of the transfer gate spacer is disposed between the floating diffusion region and the transfer gate electrode layer, and wherein, in each of the plurality of pixels, a floating diffusion contact connected to the floating diffusion region is disposed more adjacent in the first direction to the pixel isolation film than to the transfer gate structure.

According to another aspect of one or more example embodiments, an image sensor may include a pixel array including a plurality of pixels arranged in parallel to an upper surface of a substrate and a pixel isolation film disposed between the plurality of pixels, each of the plurality of pixels including at least one photodiode, a color filter disposed above the at least one photodiode, and elements disposed below the at least one photodiode; and a logic circuit configured to obtain a pixel signal from the plurality of pixels, wherein the elements include a floating diffusion region doped with impurities of a first conductivity type, a transfer gate structure adjacent to the floating diffusion region, and a transistor, wherein, in each of the plurality of pixels, the transistor is spaced apart from the floating diffusion region and from the transfer gate structure, wherein the transistor includes a gate structure, a first active region adjacent to the gate structure, and a second active region adjacent to the gate structure, and wherein a shortest distance between a floating diffusion contact connected to the floating diffusion region and the pixel isolation film is less than a shortest distance between a first active contact connected to the first active region and the pixel isolation film.

According to yet another aspect of one or more example embodiments, an image sensor may include a pixel array including a plurality of pixels arranged parallel to an upper surface of a substrate, each of the plurality of pixels including at least one photodiode, a color filter disposed on the at least one photodiode, and at least one element disposed below the at least one photodiode; and a logic circuit configured to obtain a pixel signal from the plurality of pixels, wherein each of the plurality of pixels includes a plurality of active regions and a floating diffusion region, each of the plurality of active regions and the floating diffusion region being doped with impurities of a same conductivity type, an element isolation film disposed between the plurality of active regions and the floating diffusion region, wherein a floating diffusion contact that is connected to the floating diffusion region is disposed more adjacent to the element isolation film than a plurality of active contacts respectively connected to the plurality of active regions, and wherein an area of the floating diffusion region is greater than an area of each of the plurality of active regions.

BRIEF DESCRIPTION OF DRAWINGS

The above and other aspects will be more clearly understood from the following detailed description, taken in conjunction with the accompanying drawings, in which.

DETAILED DESCRIPTION

Hereinafter, various example embodiments will be described as follows with reference to the accompanying drawings.

Figure 1:
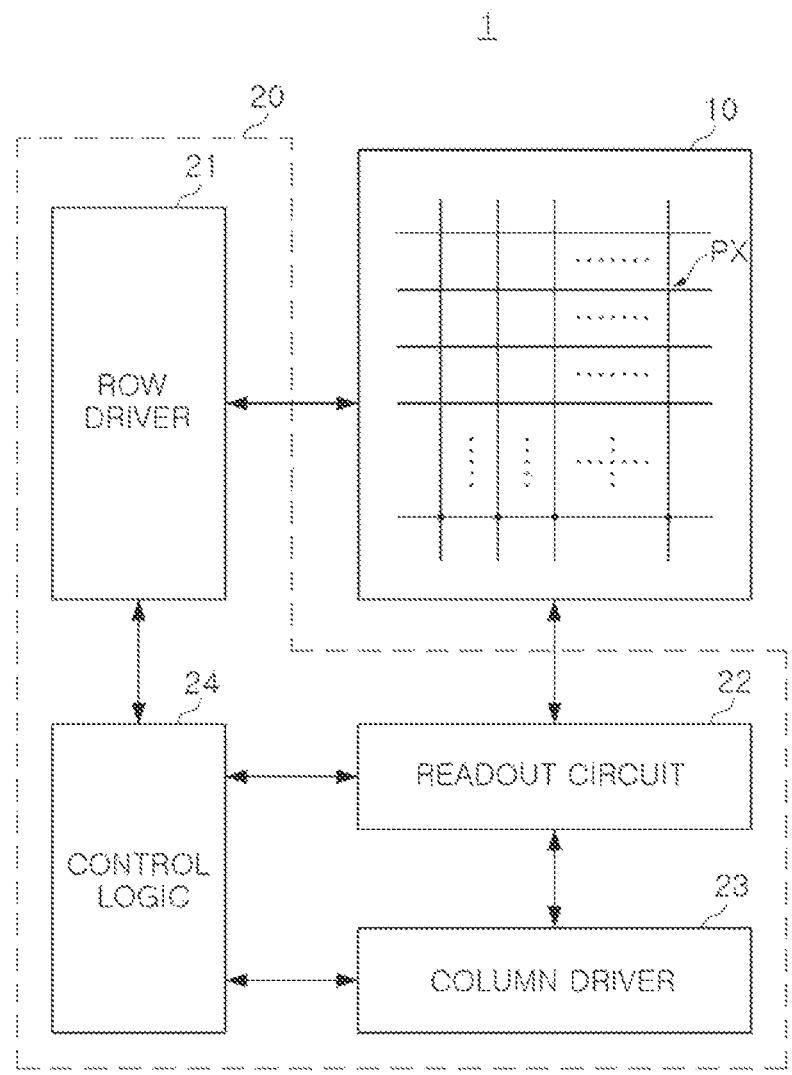
FIG. 1 is a block diagram illustrating an image sensor according to an example embodiment.

FIG. 1 is a block diagram illustrating an image sensor according to an example embodiment.

Referring to FIG. 1, an image sensor 1 may include a pixel array 10 and a logic circuit 20.

The pixel array 10 may include a plurality of pixels PX arranged in an array form along a plurality of rows and a plurality of columns. Each of the plurality of pixels PX may include at least one photoelectric conversion element configured to generate electric charges in response to light, and a pixel circuit configured to generate a pixel signal corresponding to the electric charges generated by the photoelectric conversion element. The photoelectric conversion element may include a photodiode formed of a semiconductor material, and/or an organic photodiode formed of an organic material.

For example, the pixel circuit may include a floating diffusion, a transfer transistor, a reset transistor, a driver transistor, and a select transistor. The configuration of the pixels PX may be varied in that various example embodiments. For example, each of the pixels PX may include an organic photodiode including an organic material, or may be implemented as a digital pixel, according to an example embodiment. When the pixels PX are implemented as digital pixels, each of the pixels PX may include an analog-to-digital converter for outputting a digital pixel signal.

The logic circuit 20 may include circuits for controlling the pixel array 10. For example, the logic circuit 20 may include a row driver 21, a readout circuit 22, a column driver 23, a control logic 24, and the like. The row driver 21 may drive the pixel array 10 by units of row lines. For example, the row driver 21 may generate a transfer control signal for controlling a transfer transistor of the pixel circuit, a reset control signal for controlling the reset transistor, a select control signal for controlling the select transistor, and the like, and may input the signals to the row to the pixel array 10 by unit of row line.

The readout circuit 22 may include a correlated double sampler (CDS) and an analog-to-digital converter (ADC). The correlated double samplers may be connected to the pixels PX through column lines. The correlated double samplers may read, through column lines, a pixel signal from the pixels PX connected to a row line selected by a row line selection signal of the row driver 21. The analog-to-digital converter may convert the pixel signal detected by the correlated double sampler into a digital pixel signal and may transfer the signal to the column driver 23.

The column driver 23 may include a latch or buffer for temporarily storing a digital pixel signal, an amplifier circuit, and the like, and may process a digital pixel signal received from the readout circuit 22. The row driver 21, the readout circuit 22 and the column driver 23 may be controlled by the control logic 24. The control logic 24 may include a timing controller for controlling operation timings of the row driver 21, the readout circuit 22, and the column driver 23.

Pixels PX arranged in a same position in the horizontal direction among the pixels PX may share a same column line. For example, the pixels PX disposed in a same position in the vertical direction may be simultaneously selected by the row driver 21 and may output pixel signals through column lines. In an example embodiment, the readout circuit 22 may simultaneously obtain pixel signals from the pixels PX selected by the row driver 21 through column lines. The pixel signal may include a reset voltage and a pixel voltage, and the pixel voltage may be obtained by reflecting electric charges generated in response to light in each of the pixels PX to the reset voltage.

Figure 2:
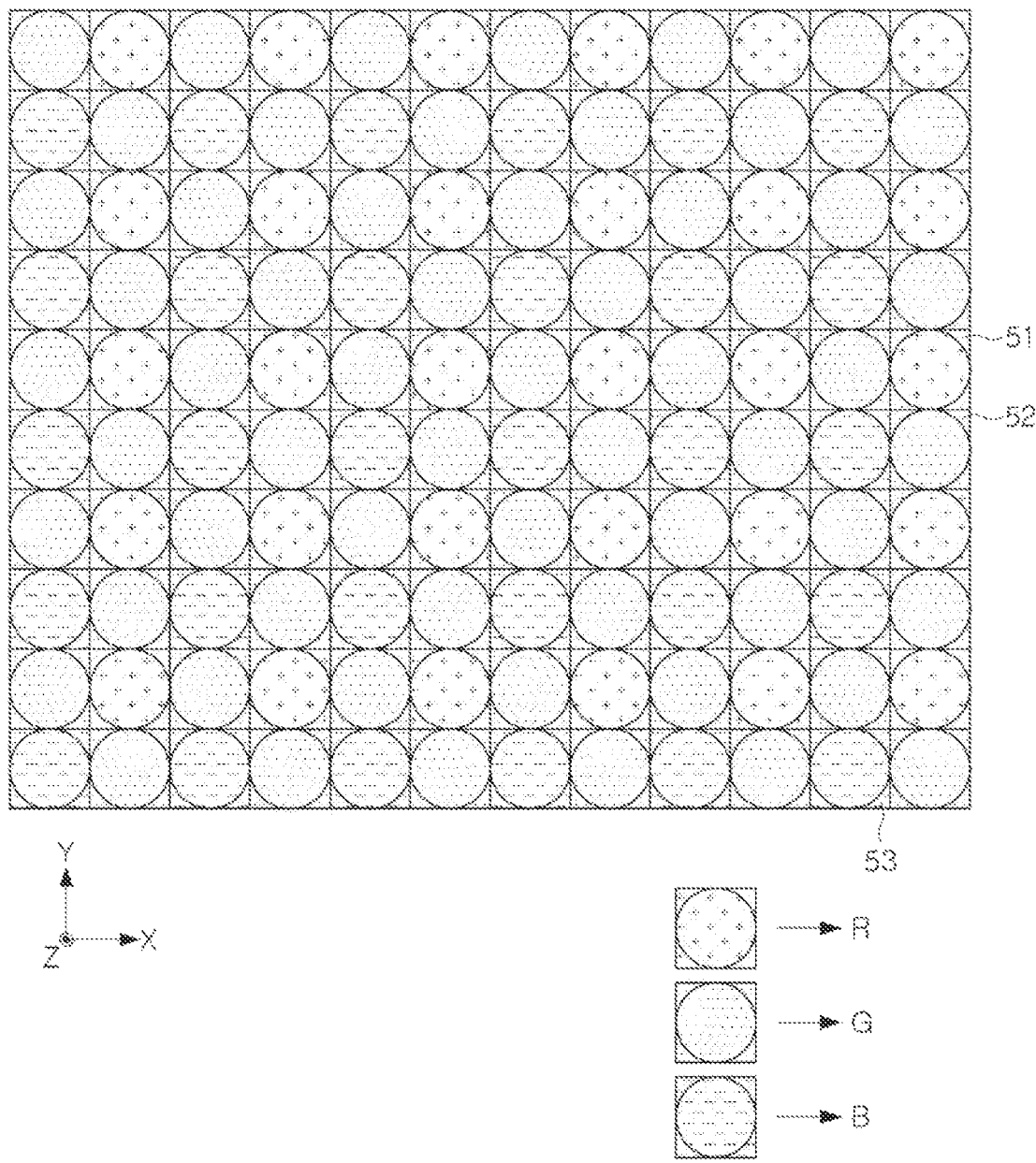
FIG. 2 is a diagram illustrating a pixel array of an image sensor according to an example embodiment.

FIG. 2 is a diagram illustrating a pixel array of an image sensor according to an example embodiment.

Referring to FIG. 2, a pixel array 50 of an image sensor in an example embodiment may include a plurality of pixels 51-53 arranged in a first direction (e.g., a X-axis direction) and a second direction (e.g., a Y-axis direction). For example, the pixel array 50 may include red pixels 51, green pixels 52, and blue pixels 53. Each of the red pixels 51 may include a red color filter, each of the green pixels 52 may include a green color filter, and each of the blue pixels 53 may include a blue color filter.

However, in example embodiments, the color filters of the pixels 51 to 53 included in the pixel array 50 may be varied. For example, at least a portion of the green pixels 52 may include a white color filter for transmitting white light, instead of the green color filter. Alternatively, at least a portion of the green pixels 52 may include a yellow color filter for transmitting yellow light, instead of the green color filter.

Figure 3:
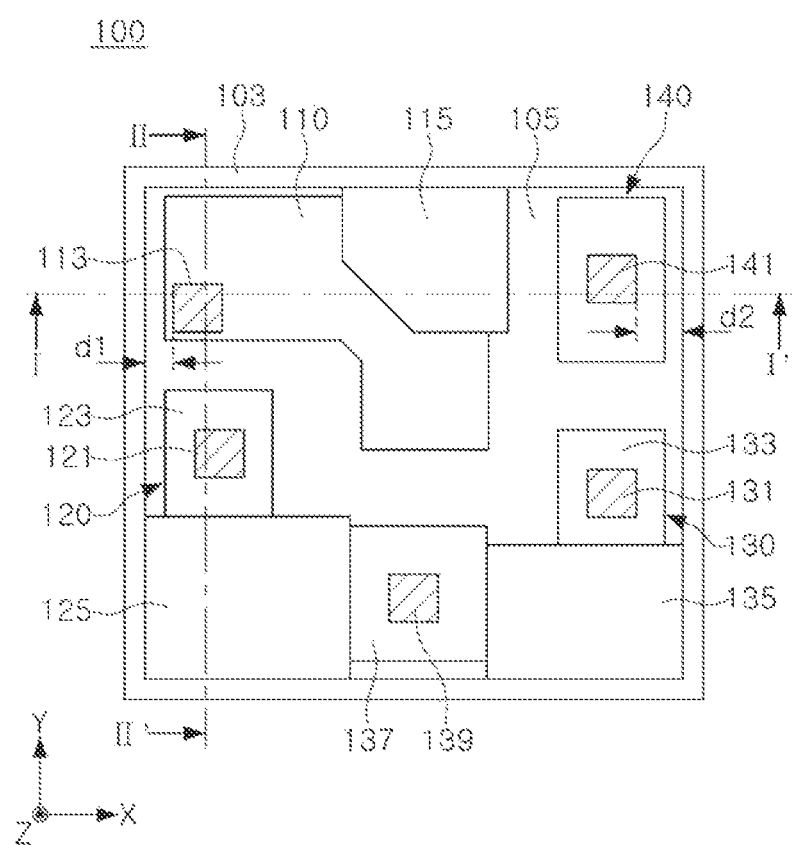
FIG. 3 is a diagram illustrating a pixel of an image sensor according to an example embodiment.

FIG. 3 is a diagram illustrating a pixel of an image sensor according to an example embodiment.

Referring to FIG. 3, a pixel 100 of an image sensor in an example embodiment may be separated from other neighboring pixels by a pixel isolation film 103. The pixel 100 may include a pixel circuit region disposed in the pixel isolation film 103. For example, the pixel circuit region may include a floating diffusion region 110, a transfer gate structure 115, a first transistor 120, and a second transistor 130. In some example embodiments, one of the first and second transistors 120 and 130 may be omitted.

The floating diffusion region 110 may be doped with the impurities of the first conductivity type, and may be a region in which charges generated by the photodiode accumulate. At least one floating diffusion contact 113 may be connected to the floating diffusion region 110. The floating diffusion region 110 may be adjacent to the transfer gate structure 115. For example, in some example embodiments, the floating diffusion region 110 may be adjacent to the transfer gate structure 115 in the first direction (e.g., the X-axis direction) and the second direction (e.g., the Y-axis direction). The transfer gate structure 115 may be adjacent to the photodiode formed in the pixel isolation film 103 in a third direction (e.g., Z-axis direction) (see FIGS. 4-5 discussed below). For example, the impurities of the first conductivity type may be an N-type impurity.

When a first bias voltage is input to the transfer gate structure 115, electric charges generated by the photodiode may not move to the floating diffusion region 110. When the voltage of the transfer gate structure 115 increases to a second bias voltage higher than the first bias voltage, electric charges generated by the photodiode may move to the floating diffusion region 110. For example, the first bias voltage may be a negative voltage, and the second bias voltage may be a positive voltage. An absolute value of the first bias voltage may be smaller than an absolute value of the second bias voltage.

In the example embodiment in FIG. 3, the floating diffusion region 110 may extend in the first direction (X-axis direction) and the second direction (Y-axis direction). However, the shape of the floating diffusion region 110 is not limited the illustrated example in FIG. 3 and may be varied in example embodiments.

The first and second transistors 120 and 130 may provide at least one of a reset transistor, a select transistor, and a driver transistor included in the pixel circuit. Referring to FIG. 3, the first transistor 120 may include a first gate structure 125, and active regions 123 and 137 disposed respectively on different sides of the first gate structure 125, and the second transistor 130 may include a second gate structure 135, and active regions 133 and 137 disposed respectively on different sides of the second gate structure 135. In the example embodiment in FIG. 3, the first transistor 120 and the second transistor 130 may share a single active region 137. An area of each of the active regions 123, 133, and 137 may be smaller than an area of the floating diffusion region 110. This configuration of the areas may allow a relatively larger area of the floating diffusion region 110 in which electric charges generated by the photodiode are accumulated.

The pixel 100 may include the floating diffusion region 110 and at least one impurity region 140 separated from each of the first and second transistors 120 and 130. In some example embodiments, the at least one impurity region 140 may be spaced apart from the floating diffusion region 110 and may be spaced apart from each of the first and second transistors 120 and 130. For example, as illustrated in FIG. 3, the floating diffusion region 110 may be disposed on one side of the transfer gate structure 115 in the first direction (e.g., the X-axis direction), and the impurity region 140 may be disposed on the other side of the transfer gate structure 115. However, the impurity region 140 may be separated from the transfer gate structure 115 by an element isolation film 105 so as not to be in contact with the transfer gate structure 115. The impurity region 140 may be separated from the first and second transistors 120 and 130 by the element isolation film 105 so as not to be in contact with the first and second transistors 120 and 130. In an example embodiment, the impurity region 140 may be doped with impurities of a second conductivity type different from impurities of the floating diffusion region 110 and the active regions 123, 133, and 137. The impurity region 140 may include a ground contact 141, and the impurity region 140 may receive a ground voltage through the ground contact 141.

A floating diffusion contact 113, contracts 121, 131, and 139, and the ground contact 141 may be connected to the floating diffusion region 110, the active regions 123, 133, and 137, and the impurity region 140, respectively, as illustrated in FIG. 3. For example, the floating diffusion contact 113 may be provided within the floating diffusion region 110, the contacts 121, 131, and 139 may be provided within the active regions 123, 133, and 137 respectively, and the ground contact 141 may be provided within the impurity region 140. Referring to FIG. 3, the floating diffusion contact 113 connected to the floating diffusion region 110 may be disposed more adjacent to the pixel isolation film 103 than each of the other contacts 121, 131, 139 and 141 are disposed with respect to the pixel isolation film 103. For example, a first distance d1, which may be a shortest distance between the pixel isolation film 103 adjacent to the floating diffusion region 110 and the floating diffusion contact 113, may be shorter than a second distance d2 which may be a shortest distance between the pixel isolation film 103 adjacent to the impurity region 140 and the ground contact 141. In some example embodiments, the first distance d1 may be shorter that distances which may be respectively the shortest distances between the pixel isolation film 103 adjacent to the active regions 123, 133, and 137 and the respective contacts 121, 131, and 139.

As described above, the first bias voltage and the second bias voltage may be input in order to the transfer gate structure 115, and while the first bias voltage is input to the transfer gate structure 115, a voltage of the floating diffusion region 110 may be reset to a power voltage through the floating diffusion contact 113. The power voltage may be predetermined. In a configuration of the related art, a leakage may occur due to a difference in voltages between the floating diffusion region 110 and the transfer gate structure 115, and electric charges generated by the leakage may be accumulated in the floating diffusion region 110 such that a white spot may occur, and a dark level may be lowered.

In various example embodiments, the leakage issue may be reduced by disposing the floating diffusion contact 113 for inputting a power supply voltage to the floating diffusion region 110 to be spaced apart from the transfer gate structure 115. Referring to FIG. 3, the contacts 121, 131, and 139 may be disposed in the center of the active regions 123, 133, 137, respectively, and the ground contact 141 may be disposed in the center of the impurity region 140, whereas the floating diffusion contact 113 may be disposed adjacent to the pixel isolation film 103, not in the center of the floating diffusion region 110.

To reduce leakage as much as possible, the floating diffusion contact 113 may be disposed within the floating diffusion region 110 so as to be spaced apart from the transfer gate structure 115 by a maximum distance possible within the floating diffusion region 110. For example, in some example embodiments, the floating diffusion contact 113 may be disposed more adjacent to the pixel isolation film 103 in the −X-axis direction than the transfer gate structure 115 in the −X-axis direction in plan view as shown in FIG. 3. In other words, the floating diffusion contact 113 may be disposed closer to the pixel isolation film 103 in the −X-axis direction than the transfer gate structure 115 in the −X-axis direction in plan view as shown in FIG. 3. The floating diffusion contact 113 may be disposed more adjacent to the element isolation film 105 in the −Y-axis direction than the contacts 121, 131, and 139 in the +Y-axis direction, and may be disposed more adjunct to the element isolation film 105 in the −Y-axis direction than the ground contact 141 in the −Y-axis direction as shown in FIG. 3. In some example embodiments, the floating diffusion contact 113 may be disposed within the floating diffusion region 110 so as to be generally diagonally spaced apart across the floating diffusion region 110 from the transfer gate structure 115. Accordingly, a shortest distance between the floating diffusion contact 113 and the transfer gate structure 115 may be longer than each of a shortest distance between of the contacts 121, 131, and 139 and the active regions 123, 133, 137, respectively. Accordingly, the distance between the floating diffusion contact 113 receiving the power supply voltage and the transfer gate structure 115 receiving the first bias voltage may be secured such that the accumulation of electric charges in the floating diffusion region 110 due to leakage may be reduced and such that white spots may occur less than in the related art and accordingly a dark level may be increased as compared with the related art.

Figure 4:
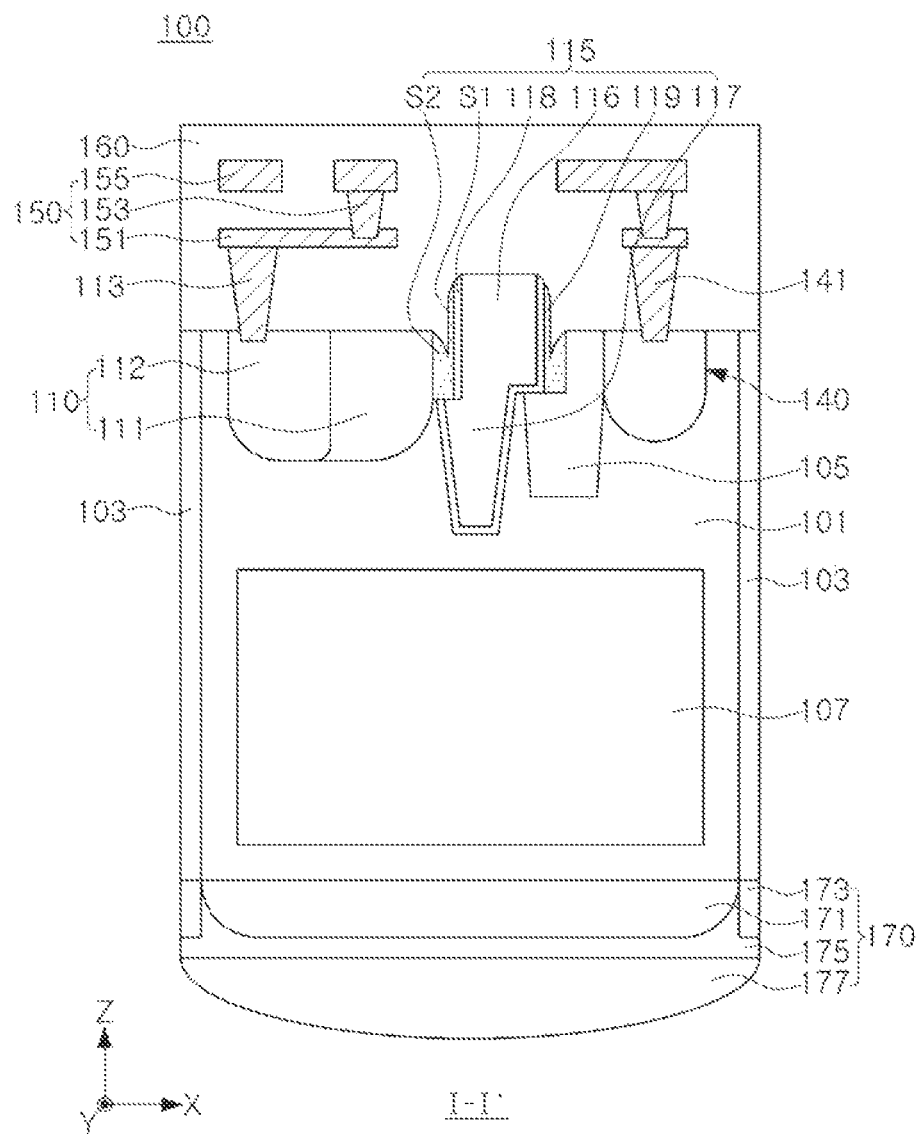
FIG. 4 is a cross-sectional diagram taken along line I-I' in FIG. 3.
Figure 5:
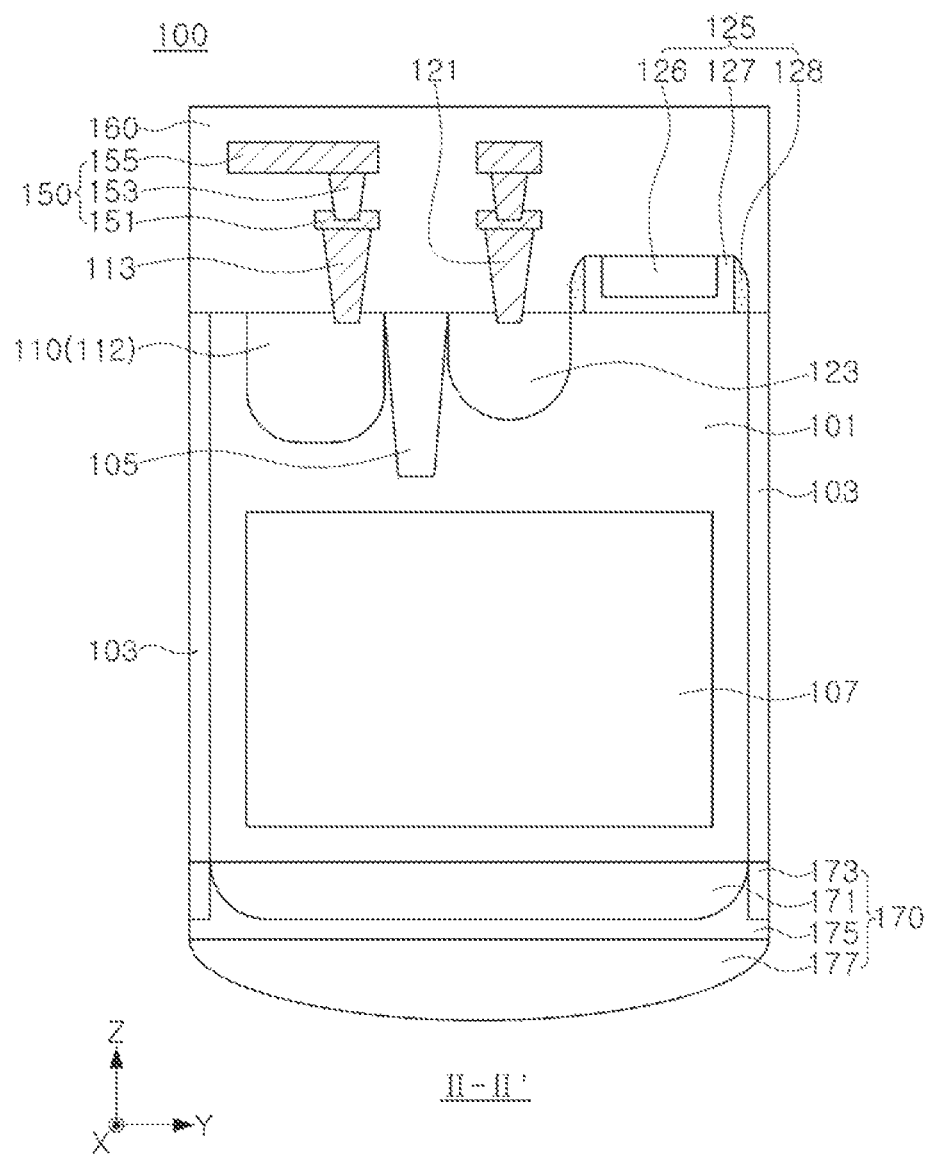
FIG. 5 is a cross-sectional diagram taken along line II-IF in FIG. 3.

FIG. 4 is a cross-sectional diagram taken along line I-I' in FIG. 3. FIG. 5 is a cross-sectional diagram taken along line II-IF in FIG. 3.

Referring to FIGS. 4 and 5, the pixel 100 may be defined by the pixel isolation film 103 formed on the substrate 101, and the photodiode 107 may be formed in the substrate 101. The photodiode 107 may be adjacent to the transfer gate structure 115 in the third direction (e.g., the Z-axis direction) and may be perpendicular to one surface of the substrate 101.

An optical unit 170 may be disposed on a surface of the substrate 101 adjacent to the photodiode 107 in the third direction (e.g., the Z-axis direction), as shown in FIGS. 4-5. The optical unit 170 may include a color filter 171, a grating structure 173, a planarization layer 175, and a microlens 177. The color filter 171 may be separated from color filters of other adjacent pixels by the grating structure 173, and may transmit light of a predetermined wavelength band. The microlens 177 may refract light incident to the pixel 100 and may focus light on the photodiode 107. The photodiode 107 may generate electric charges in response to light passing through the optical unit 170.

A pixel circuit region may be disposed on a side of the photodiode 107 opposite from the optical unit 170 in the third direction (e.g., the Z-axis direction). Accordingly, the optical unit 170 and the pixel circuit region may be disposed on opposite sides of the photodiode 107 in the third direction. The pixel circuit region may include the floating diffusion region 110, the transfer gate structure 115 adjacent to the floating diffusion region 110, and the at least one two transistors 120 and 130.

Electric charges generated by the photodiode 107 may accumulate in the photodiode 107 or may move to the floating diffusion region 110 according to the magnitude of the voltage input to the transfer gate structure 115. For example, while the first bias voltage is input to the transfer gate structure 115, electric charges may be accumulated in the photodiode 107, and when the second bias voltage greater than the first bias voltage is input to the transfer gate structure 115, electric charges in the photodiode 107 may move to the floating diffusion region 110.

The floating diffusion region 110 may include a first floating diffusion region 111 and a second floating diffusion region 112. The first floating diffusion region 111 may be doped with a first impurity concentration, and the second floating diffusion region 112 may be doped with a second impurity concentration higher than the first impurity concentration. As illustrated in FIG. 4, the first floating diffusion region 111 may be disposed between the second floating diffusion region 112 and the transfer gate structure 115. Accordingly, the first floating diffusion region 111 may be disposed more adjacent to the transfer gate structure 115 than the second floating diffusion region 112.

The transfer gate structure 115 may include a first transfer gate electrode layer 116 and a second gate transfer electrode layer 117, a transfer gate insulating layer 118, and a transfer gate spacer 119. The first and second transfer gate electrode layers 116 and 117 may be formed of a conductive material such as polysilicon, metal, or metal silicide, and the first and second bias voltages described above may be applied to the first and second transfer gate electrode layers 116 and 117. The transfer gate insulating layer 118 may be disposed between the first and second transfer gate electrode layers 116 and 117 and the substrate 101.

The first electrode layer 116 and the second electrode layer 117 may have different shapes. For example, the second electrode layer 117 may be disposed between the first electrode layer 116 and the photodiode 107 in the third direction (e.g., the Z-axis direction), and may have a width decreasing as a distance from the photodiode 107 in the third direction decreases. The second electrode layer 117 may be disposed below the upper surface of the substrate 101 and may be embedded in the substrate 101, and the first electrode layer 116 may include a region disposed below the upper surface of the substrate 101 and a region disposed above the upper surface of the substrate 101.

Since at least a portion of the transfer gate structure 115 is formed to be embedded in the substrate 101, interfacial properties may be deteriorated in the process of forming the transfer gate structure 115, such that electric charges may be generated. When the electric charges move to the photodiode 107, the dark level may be deteriorated due to the electric charges flowing in while light is not incident. In an example embodiment, as described above, the first bias voltage, which may be a negative voltage, may be input to the transfer gate structure 115, and by generating holes on an interfacial surface between the transfer gate structure 115 and the substrate 101 by the first bias voltage and combining the holes with the electric charges, electric charge may be prevented from flowing into the photodiode 107 and the deterioration of the dark level may be reduced.

The transfer gate insulating layer 118 may be formed along the interface between the first and second transfer gate electrode layers 116 and 117 and the substrate 101. The first transfer gate electrode layer 116 and the second transfer gate electrode layer 117 may be offset from each other in the second direction (X-axis direction) and may be disposed in different positions. Accordingly, at least a portion of the lower surface of the first electrode layer 116 may not be in direct contact with the upper surface of the second electrode layer 117, and at least a portion of the transfer gate insulating layer 118 may be disposed between the element isolation film 105 and the first transfer gate electrode layer 116.

The transfer gate spacer 119 may be formed of silicon nitride, and may be formed only around the first transfer gate electrode layer 116. In other words, the second transfer gate electrode layer 117 may not be adjacent to the transfer gate spacer 119 in a direction parallel to the upper surface of the substrate 101. At least a portion of the transfer gate spacer 119 may be disposed below the upper surface of the substrate 101 as illustrated in FIG. 4, and may thus be disposed in the substrate 101. At least a portion of the transfer gate spacer 119 may be disposed on a same level as a level of the floating diffusion region 110 in the third direction.

The transfer gate spacer 119 disposed between the floating diffusion region 110 and the first transfer gate electrode layer 116 may include a first spacer region S1 and a second spacer region S2. The first spacer region S1 may extend along the side surface of the transfer gate insulating layer 118, and the second spacer region S2 may extend along the side surface of the floating diffusion region 110. The first spacer region S1 may be formed to be longer than the second spacer region S2 in the third direction. In other word, a length of the second spacer region S2 in the third direction may be less that a length of the first spacer region S1 in the third direction. In some example embodiments, the length of the second spacer region S2 may be less than a depth of the floating diffusion region 110 in the third direction. The first spacer region S1 and the second spacer region S2 may be in contact with each other below the upper surface of the substrate 101. However, an upper portion of the second spacer region S2 may be separated from an upper portion of the first spacer region S1 in the second direction, and accordingly, as illustrated in FIG. 4, the transfer gate spacer 119 may include a valley region between the upper portion of the first spacer region S1 and the upper portion of the second spacer region S2 in the second direction and accordingly, the transfer gate spacer 119 may include a valley region between the floating diffusion region 110 and the first transfer gate electrode layer 116.

A wiring region 150 may be disposed on the substrate 101. The wiring region 150 may include lower wiring patterns 151 connected to the floating diffusion contact 113, to the contacts 121, 131, 139 and to the ground contact 141, wiring vias 153, and upper wiring patterns 155. The wiring region 150 may be formed in an interlayer insulating layer 160 formed on the substrate 101. The floating diffusion region 110, the transfer gate structure 115, and the first and second transistors 120 and 130 included in the pixel 100 may be electrically connected to each other by the wiring region 150.

The first and second gate structures 125 and 135 respectively of the first and second transistors 120 and 130 may each have a shape different from a shape of the transfer gate structure 115. Referring to FIG. 5, the first gate structure 125 of the first transistor 120 may be formed on the substrate 101 and may include a gate electrode layer 126, a gate insulating layer 127, and a gate spacer 128. Referring to FIGS. 4 and 5, the length of each of the first and second gate structures 125 and 135 may be shorter than a length of the transfer gate structure 115 in the third direction (e.g., the Z-axis direction) perpendicular to the upper surface of the substrate 101.

Figure 6:
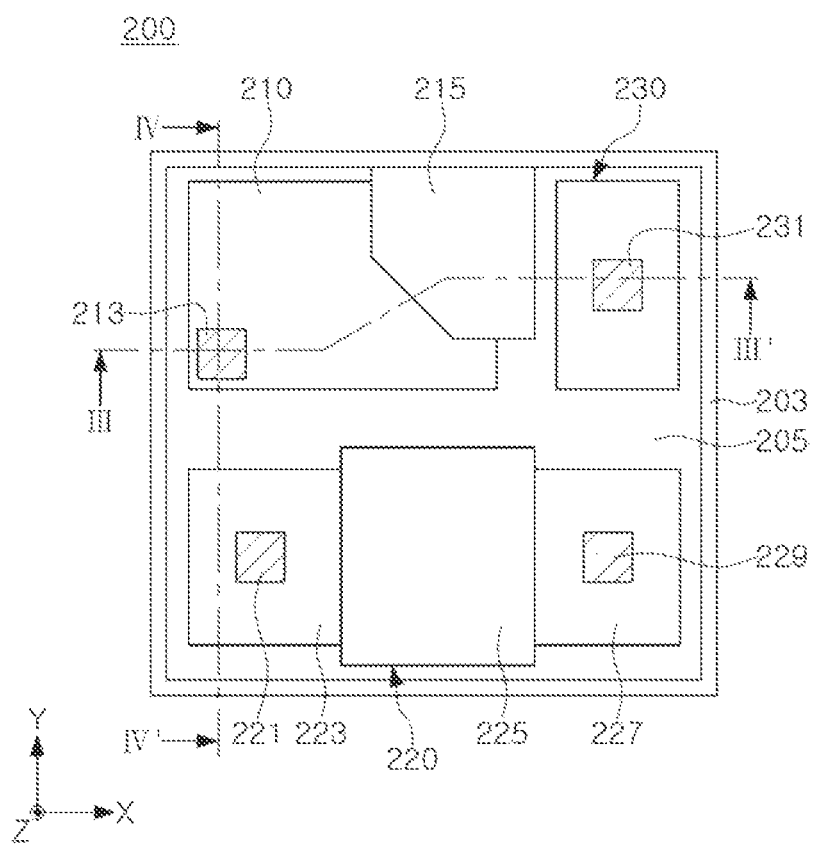
FIG. 6 is a diagram illustrating a pixel of an image sensor according to an example embodiment.
Figure 7:
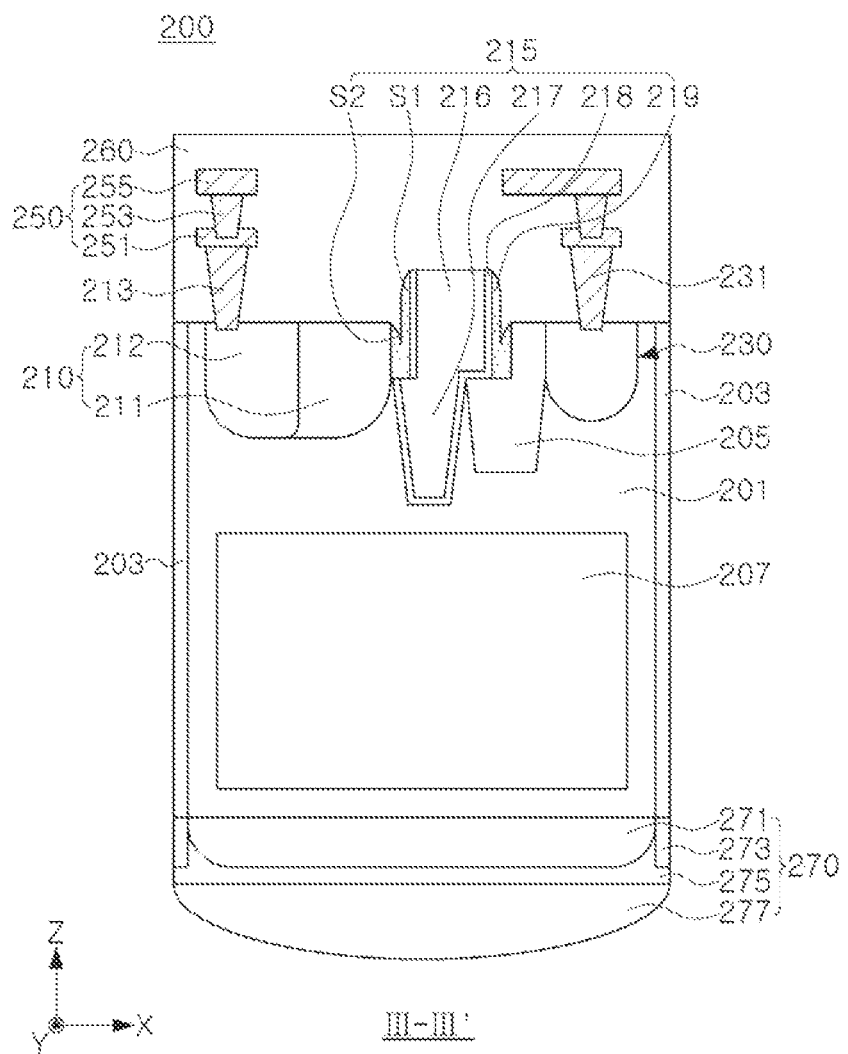
FIG. 7 is a cross-sectional diagram taken along line in FIG. 6.
Figure 8:
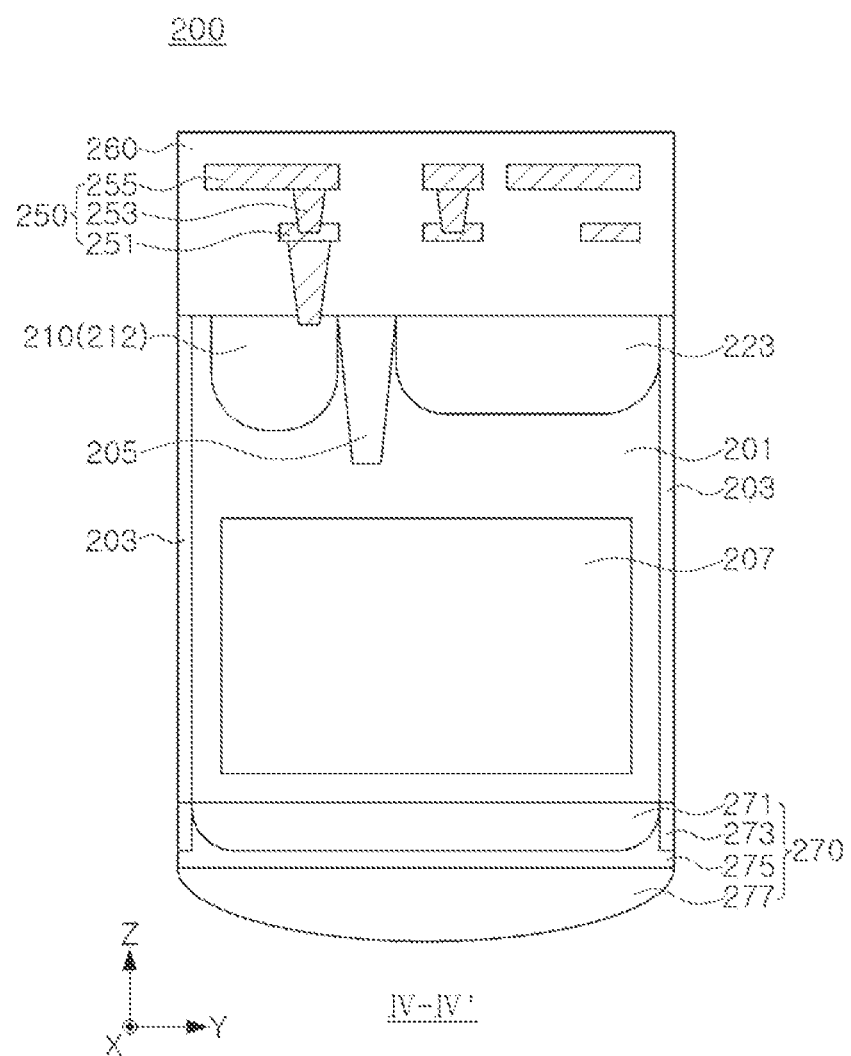
FIG. 8 is a cross-sectional diagram taken along line IV-IV' in FIG. 6.

FIG. 6 is a diagram illustrating a pixel of an image sensor according to an example embodiment. FIG. 7 is a cross-sectional diagram taken along line in FIG. 6. FIG. 8 is a cross-sectional diagram taken along line IV-IV' in FIG. 6.

Referring to FIGS. 6 to 8, a pixel 200 may be separated from other neighboring pixels by a pixel isolation film 203. The pixel 200 may include a pixel circuit region disposed in the pixel isolation film 203, and the pixel circuit region may include a floating diffusion region 210, a transfer gate structure 215, and at least one transistor 220.

The floating diffusion region 210 may be a region in which electric charges generated by the photodiode are accumulated, and at least one floating diffusion contact 213 may connected to the floating diffusion region 210. The floating diffusion region 210 may be adjacent to the transfer gate structure 215. The transfer gate structure 215 may be adjacent to the photodiode formed in the pixel isolation film 203 in the third direction (e.g., the Z-axis direction).

Referring to FIG. 6, the floating diffusion region 210 may have a generally rectangular shape. However, the shape of the floating diffusion region 210 may be varied in example embodiments.

The transistor 220 may provide one of a reset transistor, a select transistor, and a driver transistor included in the pixel circuit. Referring to FIG. 6, the transistor 220 may include a gate structure 225, a first active region 223, and a second active region 227 disposed on sides of the gate structure 225. Referring to FIG. 6, an area of each of the first and second active regions 223 and 227 included in the transistor 220 may be smaller than an area of the floating diffusion region 210 to provide a relatively larger area of the floating diffusion region 210 in which electric charges generated by the photodiode are accumulated. An area of the transfer gate structure 215 may be smaller than the area of the gate structure 225.

The pixel 200 may include at least one impurity region 230 separated from the floating diffusion region 210 and the transistor 220. In some example embodiments, the at least one impurity region 230 may be spaced apart from the floating diffusion region 210 and spaced apart from the transistor 220. For example, as illustrated in FIG. 6, the floating diffusion region 210 may be disposed on one side of the transfer gate structure 215 in the first direction (e.g. the X-axis direction), and the impurity region 230 may be disposed on the other side of the transfer gate structure 215 in the first direction. The impurity region 230 may be separated from the transfer gate structure 215 by the element isolation film 205. In an example embodiment, the impurity region 230 may be doped with impurities of the same conductivity type as impurities of the floating diffusion region 210. The impurity region 230 may include a ground contact 231, and may receive a ground voltage through the ground contact 231.

A first active contact 221 and a second active contact 229 may be connected to the first and second active regions 223 and 227, respectively. In the first and second active regions 223 and 227, the first and second active contacts 221 and 229 may be arranged in the centers of the first and second active regions 223 and 227, respectively. Similarly, the ground contact 231 may be arranged in the center of the impurity region 230.

However, the floating diffusion contact 213 may not be disposed in the center of the floating diffusion region 210, but may be disposed adjacent to one of boundaries of the floating diffusion region 210 as much as possible. Accordingly, as illustrated in FIG. 6, the floating diffusion contact 213 and the first active contact 221 connected to the first active region 223 of the transistor 220 may be offset from each other in the first direction (e.g., the X-axis direction) and may be disposed in different positions within the floating diffusion region 210 and the first active region 223, respectively. An area of the impurity region 230 may be smaller than an area of the second active region 227. Since the impurity region 230 and the second active region 227 adjacent to each other have different sizes of areas, the ground contact 231 and the second active contact 229 may also be offset from each other in the first direction (e.g., the X-axis direction).

As an example, the position of the floating diffusion contact 213 may be determined in the floating diffusion region 210 to be adjacent to the pixel isolation film 203 as much as possible. Accordingly, a distance between the floating diffusion contact 213 and the transfer gate structure 215 may be sufficiently secured, and the issues in which, while a power voltage is input to the floating diffusion contact 213 and a first bias which may be a negative voltage is input to the transfer gate structure 215, a leakage current may occur due to a gate induced drain leakage (GIDL) such that white spots are generated in an image and a dark level is lowered may be addressed. For example, the floating diffusion contact 213 may be disposed more adjacent to the pixel isolation film 203 in the −X-axis direction than the transfer gate structure 215 in the −X-axis direction. The floating diffusion contact 213 may be disposed more adjacent to the isolation film 205 in the −Y-axis direction than the first and second contacts 221 and 229 are to the isolation film 205 in the +Y-axis direction, and the floating diffusion contact 213 may be disposed more adjacent to the isolation film 205 in the −Y-axis direction than the ground contact 231 in the −Y-axis direction.

The floating diffusion contact 213 may be disposed adjacent to the pixel isolation film 203 as much as possible, whereas the first and second active contacts 221 and 229 may be aligned in the centers of the first and second active regions 223 and 227. Accordingly, a shortest distance between the floating diffusion contact 213 and the transfer gate structure 215 may be longer than a shortest distance between each of the first and second active contacts 221 and 229 and the gate structure 225.

Referring to FIG. 7, the transfer gate structure 215 may have a structure similar to the structure described with reference to FIG. 4. In an example, the transfer gate structure 215 may include a first transfer gate electrode layer 216 and a second transfer gate electrode layer 217, a transfer gate insulating layer 218, and a transfer gate spacer 219. The transfer gate spacer 219 adjacent to the floating diffusion region 210 may have a first spacer region S1 and a second spacer region S2. A valley region may be formed between the first spacer region S1 and the second spacer region S2 similar to the valley region discussed above with respect to FIGS. 4-5 and thus a repeated description thereof is omitted for conciseness.

Referring to FIGS. 7 and 8, the floating diffusion region 210 may include a first floating diffusion region 211 and a second floating diffusion region 212, and the floating diffusion contact 213 may be connected to the second floating diffusion region 212 having a relatively higher impurity concentration. For example, an impurity concentration of the second floating diffusion region 212 may be three times or more an impurity concentration of the first floating diffusion region 211. A wiring region 250 and an interlayer insulating layer 260 may be disposed on the substrate 201, and the wiring region 250 may include lower wiring patterns 251, wiring vias 253, and upper wiring patterns 255. The configurations of the elements illustrated in FIGS. 7-8 are similar to the corresponding elements illustrated with respect to FIGS. 4-5 and thus a repeated description thereof is omitted for conciseness.

Figure 9A:
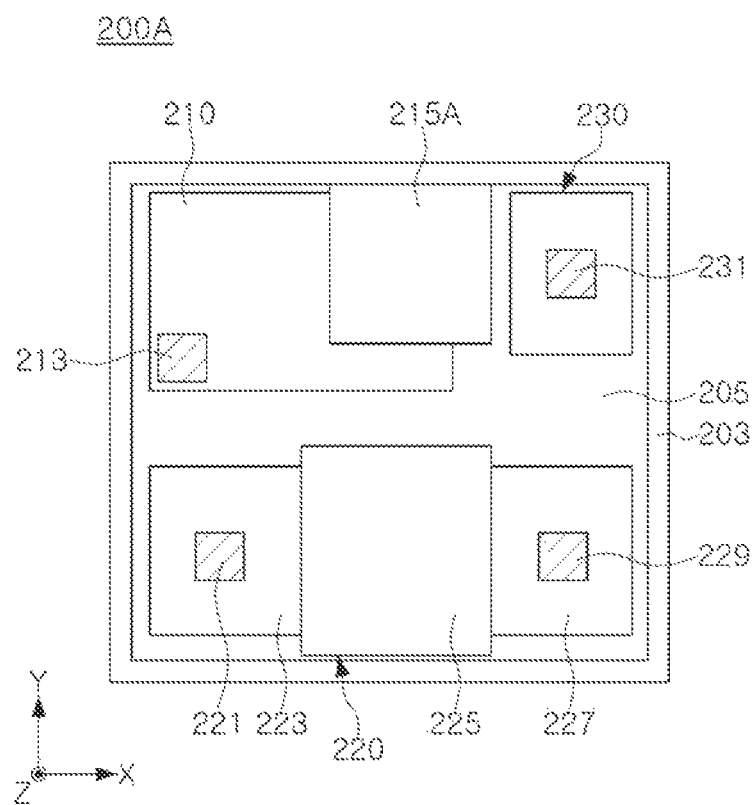
FIGS. 9A to 9C are diagrams illustrating a pixel of an image sensor according to various example embodiments.
Figure 9B:
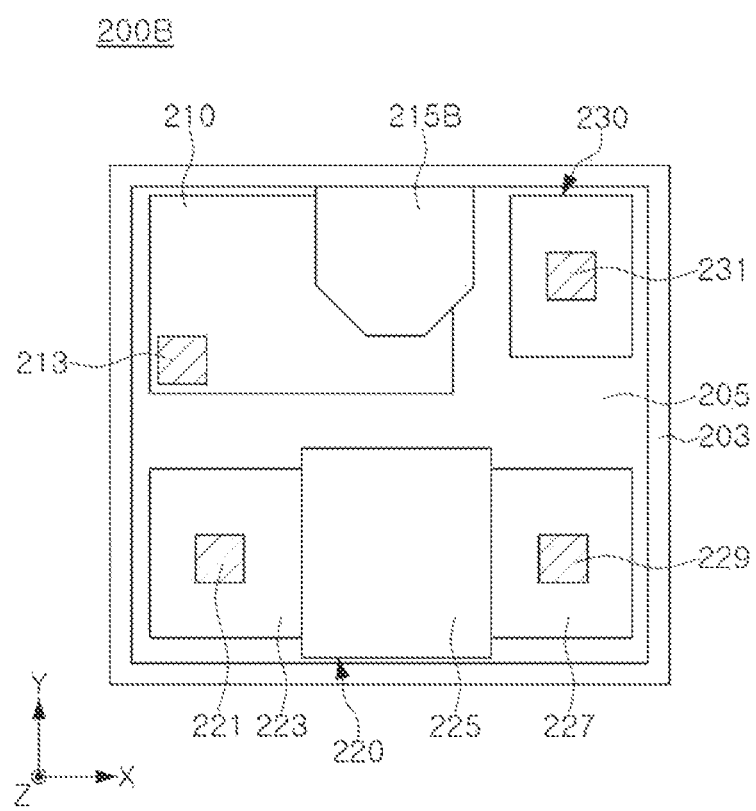
Figure 9C:
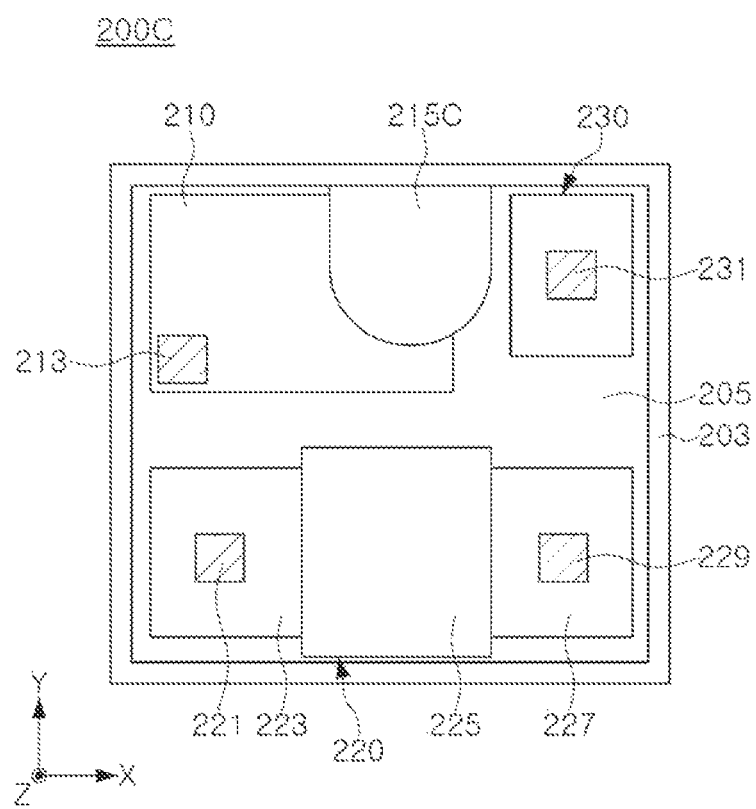

FIGS. 9A to 9C are diagrams illustrating a pixel of an image sensor according to various example embodiments.

Referring to FIGS. 9A to 9C, pixels 200A, 200B, and 200C of an image sensor are similar to the pixel 200 described above with respect to FIGS. 6-8 and includes similar elements. The configurations of the elements illustrated in FIGS. 9A-9C are similar to the corresponding elements illustrated with respect to FIGS. 6-8 and thus a repeated description thereof is omitted for conciseness. The description will thus focus on the differences from the pixel 200 illustrated in FIGS. 6-8. In the example embodiment illustrated in FIG. 9A, a transfer gate structure 215A may have a rectangular shape, differently from the example embodiment described with reference to FIGS. 6 to 8.

In the example embodiment illustrated in FIG. 9B, a portion of a transfer gate structure 215B may have a hexagonal shape, and in the example embodiment illustrated in FIG. 9C, a portion of a transfer gate structure 215C may have a semicircular shape. As described with reference to FIGS. 9A to 9C, the shapes of the transfer gate structures 215A, 215B, and 215C are not limited to the example embodiments, and according to various example embodiments, the transfer gate structures 215A, 215B, and 215C may have shapes different from the examples described with reference to FIGS. 6 and 9A to 9C.

Figure 10:
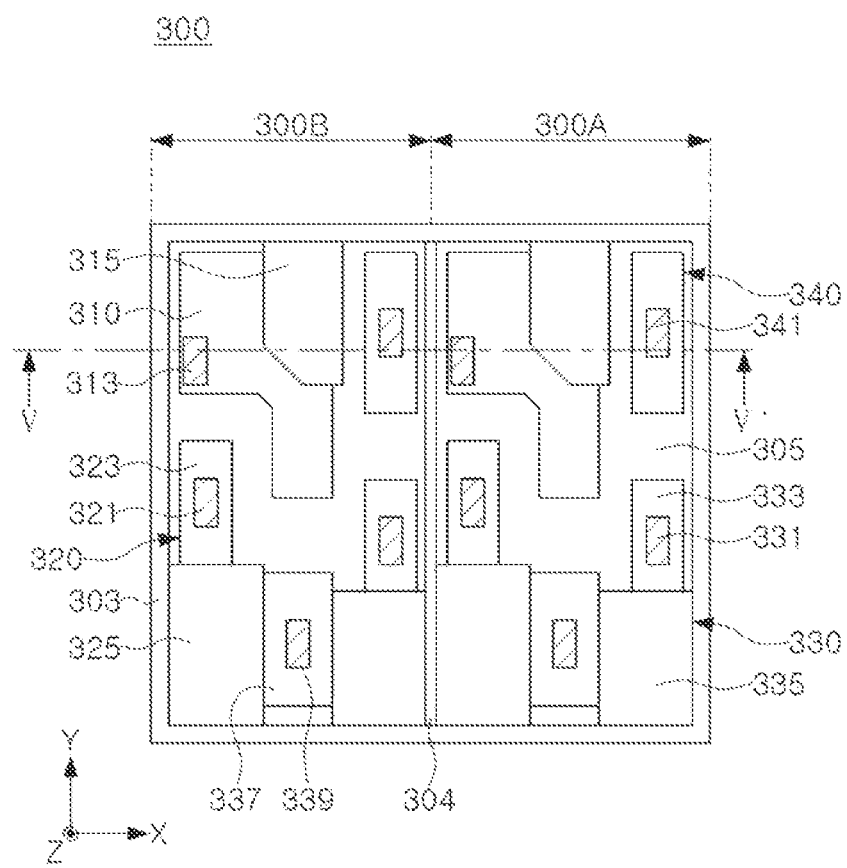
FIG. 10 is a diagram illustrating a pixel of an image sensor according to an example embodiment.
Figure 11:
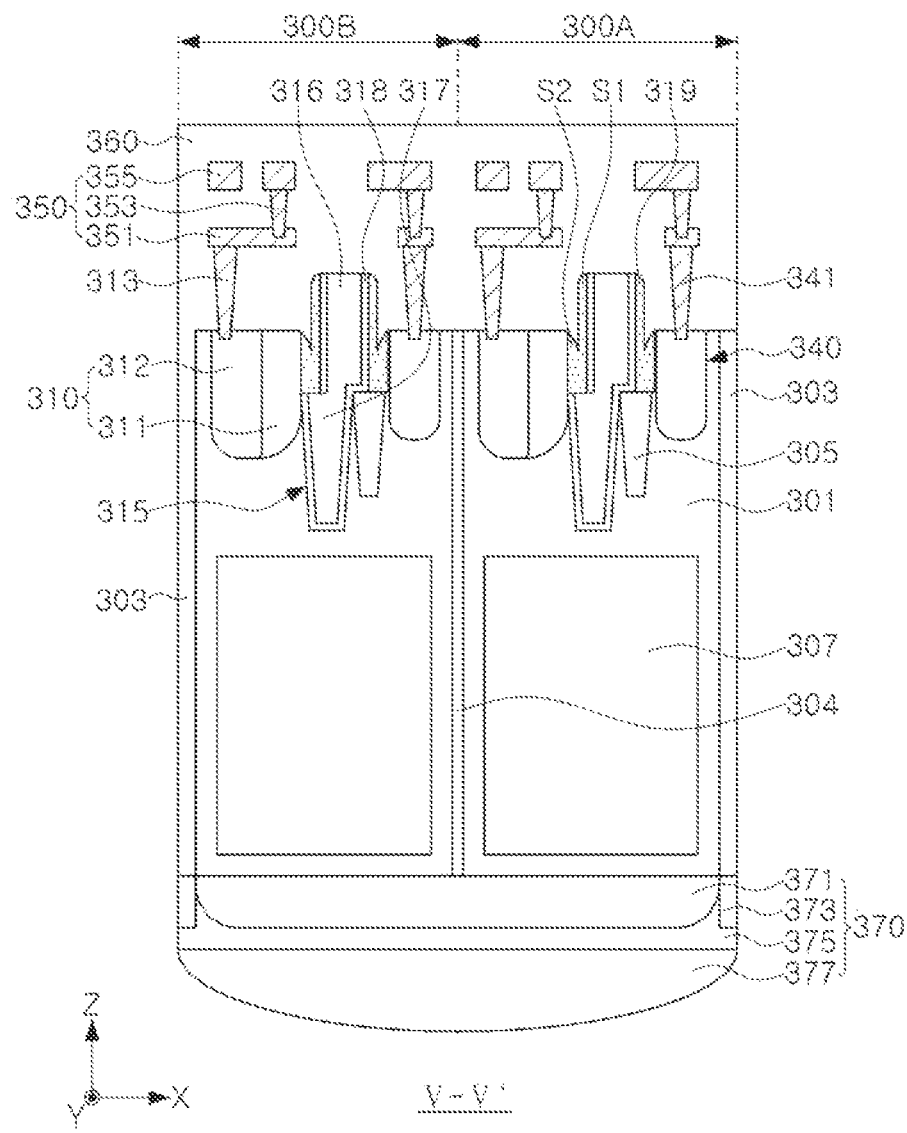
FIG. 11 is a cross-sectional diagram taken along line V-V' in FIG. 10.

FIG. 10 is a diagram illustrating a pixel of an image sensor according to an example embodiment. FIG. 11 is a cross-sectional diagram taken along line V-V' in FIG. 10.

In the example embodiment in FIGS. 10 and 11, a pixel 300 of an image sensor may include a first pixel region 300A and a second pixel region 300B. In some example embodiments, the first pixel region 300A and the second pixel region 300B may be similar in configuration. The first pixel region 300A and the second pixel region 300B may be separated from each other by an internal pixel isolation film 304. In some example embodiments, the first pixel region 300A and the second pixel region 300B may be spaced apart from each other by the internal pixel isolation film 304. Referring to FIG. 10, the internal pixel isolation film 304 may be connected to a pixel isolation film 303 for separating the pixel 300 from the other pixels. For example, a width of the internal pixel isolation film 304 may be smaller than a width of the pixel isolation film 303.

Each of the first pixel region 300A and the second pixel region 300B may include a photodiode 307, a floating diffusion region 310, a transfer gate structure 315, a first transistor 320, and a second transistor 330 disposed therein. In each of the first pixel region 300A and the second pixel region 300B, the floating diffusion region 310 may include a first floating diffusion region 311 and a second floating diffusion region 312. The transfer gate structure 315 may include a first transfer gate electrode layer 316 and a second transfer gate electrode layer 317, a transfer gate insulating layer 318, and a transfer gate spacer 319. The transfer gate spacer 319 adjacent to the floating diffusion region 310 may include a first spacer region S1 and a second spacer region S2.

A wiring region 350 and an interlayer insulating layer 360 may be formed on one surface of the substrate 301, and the configuration of the wiring region 350 may be similar to the example described above. An optical unit 370 may be formed on the other surface of the substrate 301, and the optical unit 370 may include a color filter 371, a grating structure 373, a planarization layer 375, and a microlens 377. For example, in some example embodiments, the first pixel region 300A and the second pixel region 300B included in a single pixel 300 may share a single optical unit 370. Accordingly, the photodiode 307 of the first pixel region 300A and the photodiode 307 of the second pixel region 300B may generate electric charges in response to light of the same color.

For example, the logic circuit of the image sensor may generate a first pixel signal and a second pixel signal using electric charges generated by the photodiode 307 of each of the first pixel region 300A and the second pixel region 300B. Also, the logic circuit may calculate a phase difference between the first pixel signal and the second pixel signal, and may implement an autofocus function focusing on a subject based on the phase difference. Accordingly, the pixel 300 according to the example embodiment illustrated in FIGS. 10 and 11 may function as an autofocus pixel in the image sensor. A portion of the plurality of pixels included in the image sensor may be implemented as autofocus pixels, or the entire plurality of pixels included in the image sensor may be implemented as autofocus pixels.

In the pixel 300 according to the example embodiment illustrated in FIGS. 10 and 11, the first pixel region 300A and the second pixel region 300B may be separated from each other by the pixel internal isolation film 304 in the first direction (e.g., the X-axis direction). Accordingly, the logic circuit may implement an autofocus function in the first direction based on the first pixel signal and the second pixel signal. In example embodiments, at least one of the plurality of pixels included in the image sensor may include pixel regions separated from each other in the second direction (e.g., the Y-axis direction).

In example embodiments, a floating diffusion region 310 and a transfer gate structure 315 may be disposed in each of the first pixel region 300A and the second pixel region 300B, but only the first transistor 320 and the second transistor 330 may be disposed in the pixel 300. In other words, the first transistor 320 and the second transistor 330 may not be disposed in each of the first pixel region 300A and the second pixel region 300B, but may be provided in common to the first pixel region 300A and the second pixel region 300B. In this case, the internal pixel isolation film 304 may not completely cross the pixel 300 in the second direction (e.g., the Y-axis direction). In other words, the length of the internal pixel isolation film 304 in the second direction may be shorter than the length of the pixel 300, and the active region 337 shared by the first and second transistors 320 and 330 may be disposed in the region in which the internal pixel isolation film 304 is not formed.

Figure 12:
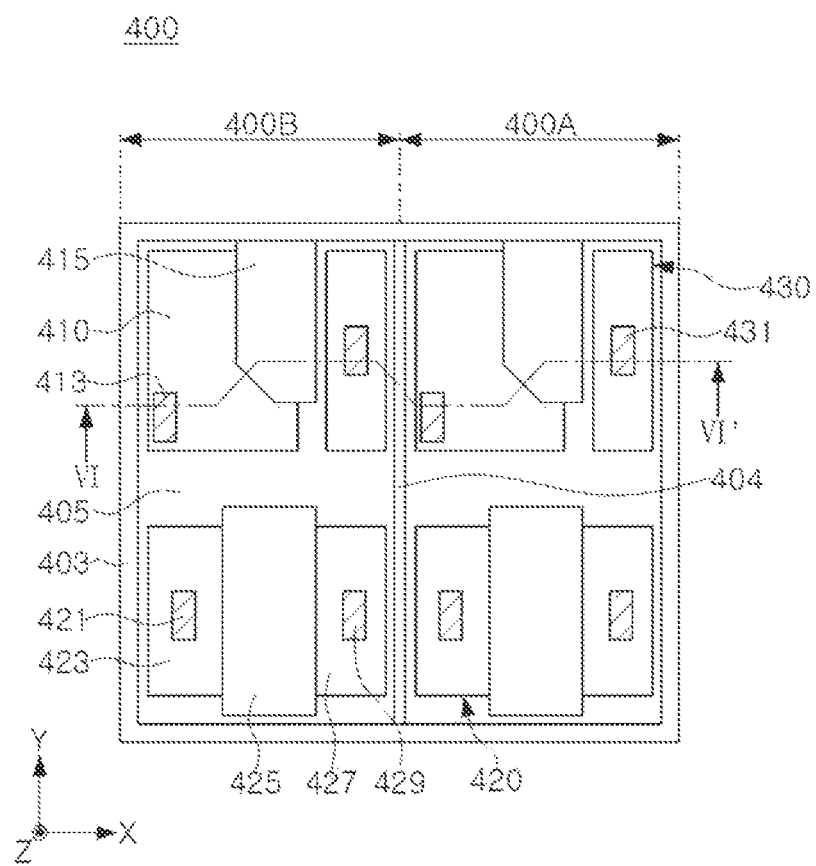
FIG. 12 is a diagram illustrating a pixel of an image sensor according to an example embodiment.
Figure 13:
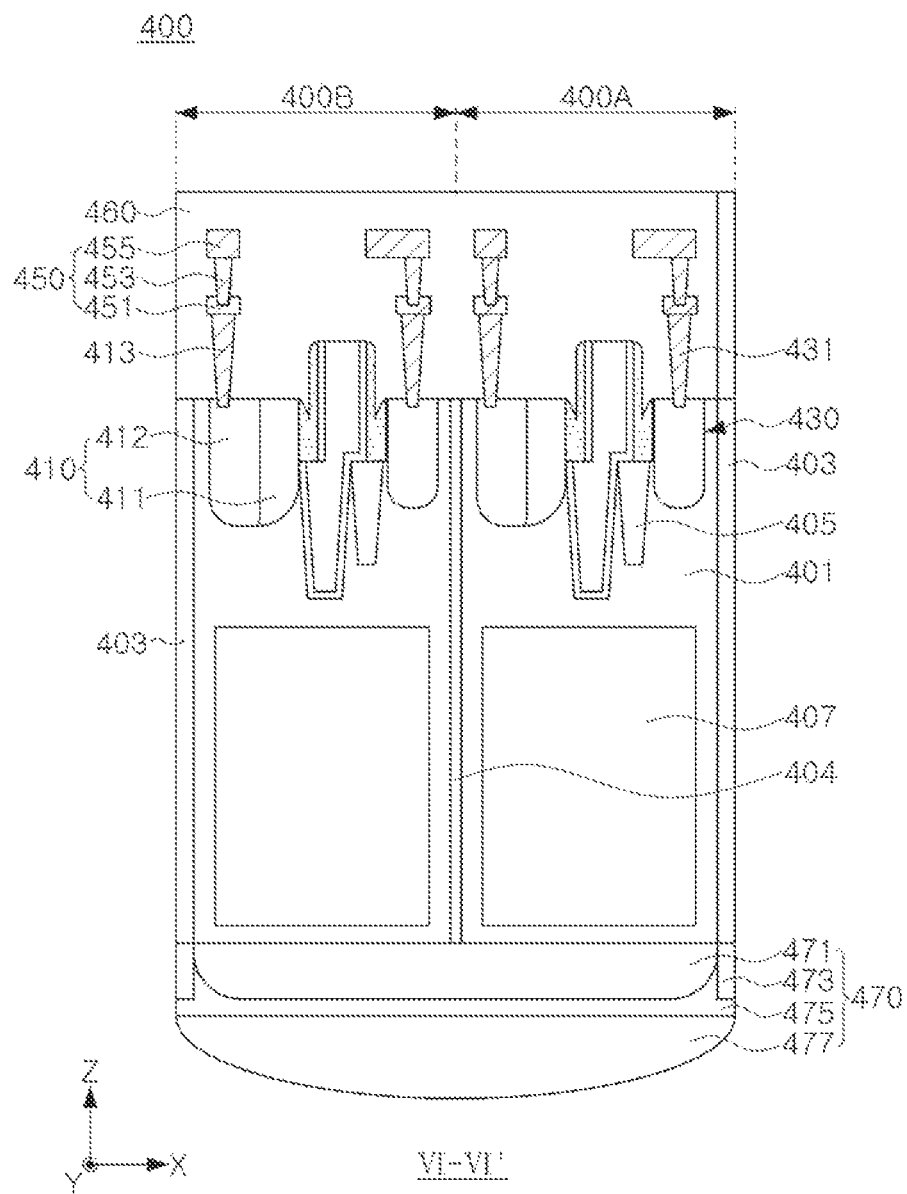
FIG. 13 is a cross-sectional diagram taken along line VI-VI' in FIG. 12.

FIG. 12 is a diagram illustrating a pixel of an image sensor according to an example embodiment. FIG. 13 is a cross-sectional diagram taken along line VI-VI' in FIG. 12.

In the example embodiment in FIGS. 12 and 13, a pixel 400 of an image sensor may include a first pixel region 400A and a second pixel region 400B separated from each other by an internal pixel isolation film 404. In some example embodiments, the first pixel region 400A and the second pixel region 400B may be spaced apart from each other by the internal pixel isolation film 404. In some example embodiments, the first pixel region 400A and the second pixel region 400B may be similar in configuration. The internal pixel isolation film 404 may be connected to the pixel isolation film 403. For example, a width of the internal pixel isolation film 404 may be smaller than a width of the pixel isolation film 403.

A photodiode 407, a floating diffusion region 410, a transfer gate structure 415, and at least one transistor 420 may be disposed in each of the first pixel region 400A and the second pixel region 400B. The arrangement and structures of the floating diffusion region 410, the transfer gate structure 415, and the transistor 420 in each of the first pixel region 400A and the second pixel region 400B may be similar to the examples described with reference to FIGS. 6 to 8, and thus a repeated description thereof is omitted for conciseness.

A wiring region 450 and an interlayer insulating layer 460 may be formed on one surface of the substrate 401, and an optical unit 470 may be formed on the other surface of the substrate 401. The optical unit 470 may include a color filter 471, a grating structure 473, a planarization layer 475, a microlens 477, and a first pixel region 400A and the second pixel region 400B may share a single optical unit 470. As described above, the logic circuit of the image sensor may generate a first pixel signal and a second pixel signal using electric charges generated by the photodiode 407 of each of the first pixel region 400A and the second pixel region 400B, and may implement an autofocus function using a phase difference between the first pixel signal and the second pixel signal.

In example embodiments, a floating diffusion region 410 and a transfer gate structure 415 may be disposed in each of the first pixel region 400A and the second pixel region 400B, but only a single transistor 420 may be disposed in the pixel 400. In other words, the transistor 420 may not be disposed in each of the first pixel region 400A and the second pixel region 400B, but may be provided in common to the first pixel region 400A and the second pixel region 400B. Similarly to the example embodiment described above with reference to FIG. 10, a length of the internal pixel isolation film 404 may be shorter than a length of the pixel 400 in the second direction (e.g., the Y-axis direction), and a transistor may be formed in a region in which the internal pixel isolation film 404 is not formed. In this case, for example, at least a partial region of the transistor 420, such as, for example, a gate structure 425, may be disposed between the internal pixel isolation film 404 and the pixel isolation film 403 in the second direction.

Figure 14:
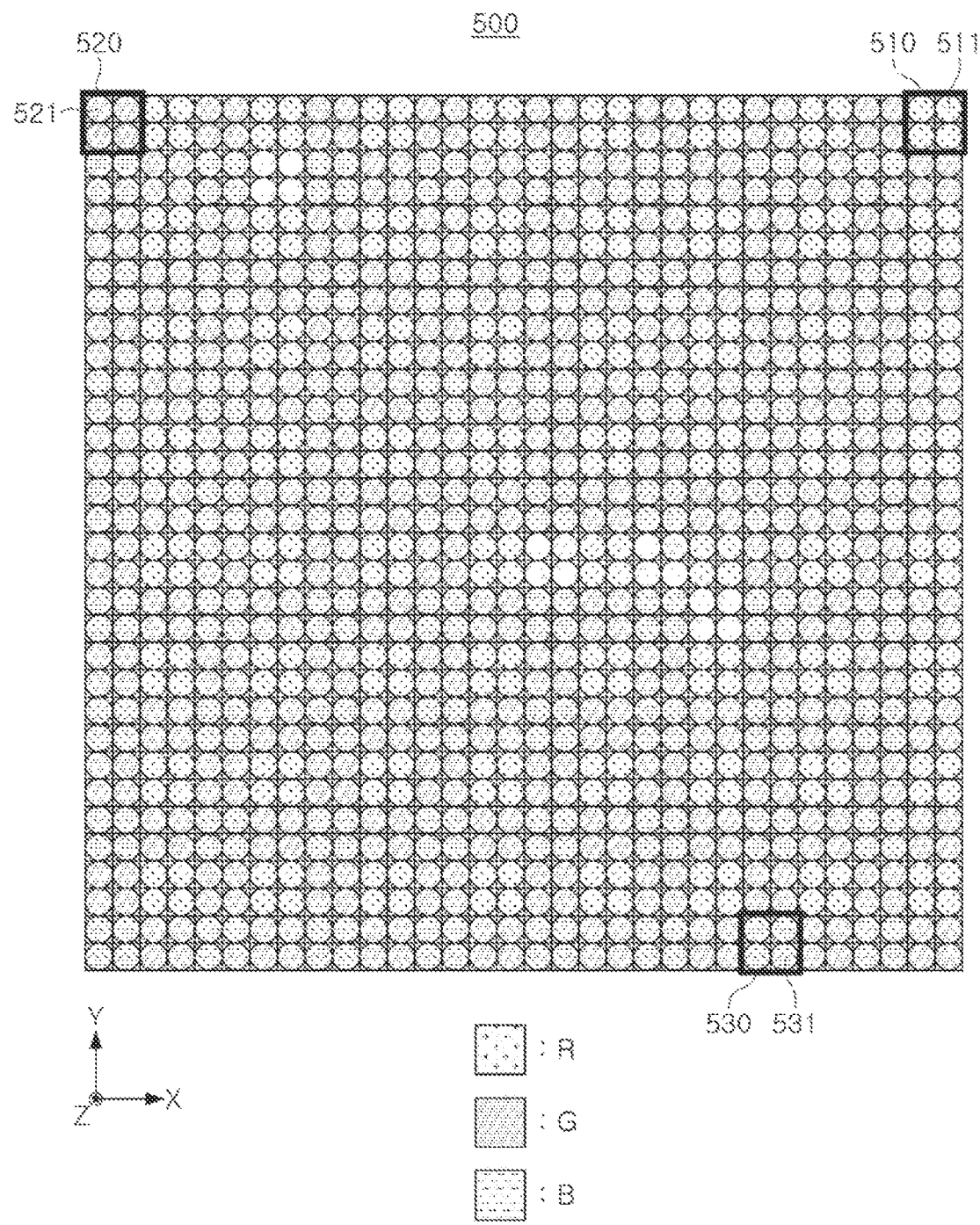
FIGS. 14 and 15 are diagrams illustrating a pixel array of an image sensor according to an example embodiment.
Figure 15:
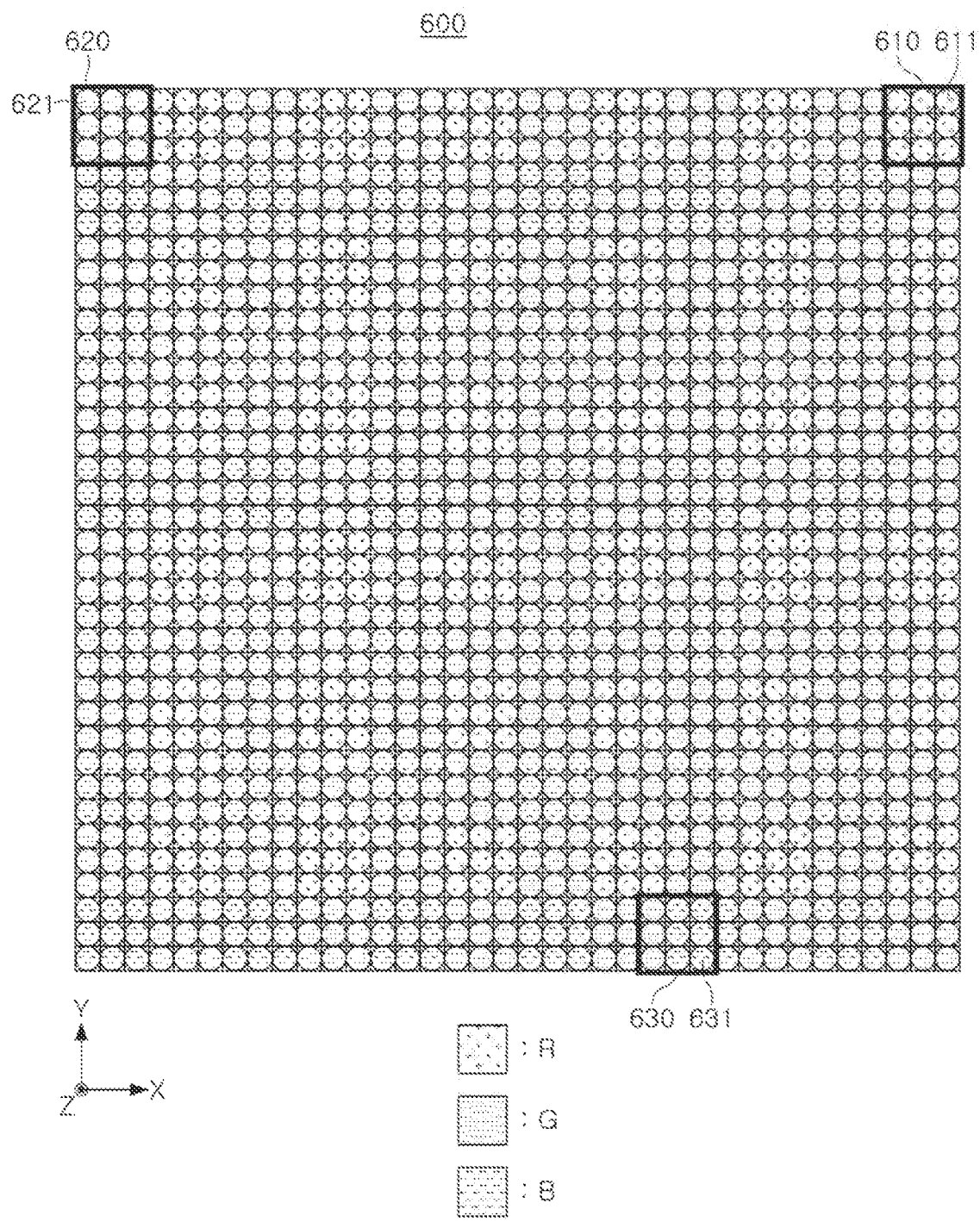

FIGS. 14 and 15 are diagrams illustrating a pixel array of an image sensor according to an example embodiment.

Referring to FIG. 14, a pixel array 500 of an image sensor in an example embodiment may include a plurality of pixel groups 510, 520, and 530 arranged in a horizontal direction (e.g., the first direction, X-axis direction) and a vertical direction (e.g., the second direction, Y-axis direction). In the example embodiment in FIG. 14, each of the plurality of pixel groups 510, 520, and 530 may include two or more pixels 511, 521, and 531 adjacent to each other in at least one of a horizontal direction and a vertical direction.

In each of the plurality of pixel groups 510, 520, and 530, the two or more pixels 511, 521, and 531 may include a color filter of the same color. For example, each of the first pixel groups 510 may include a plurality of red pixels 511 having a red color filter, and each of the second pixel groups 520 may include a plurality of green pixels 521 having a green color filter. Each of the third pixel groups 530 may include a plurality of blue pixels 531 having a blue color filter. However, the color of the color filter may be varied in example embodiments. For example, each of the second pixel groups 520 alternately arranged with the first pixel groups 510 in the horizontal direction may include green pixels 521 having a green color filter, whereas each of the second pixel groups 520 alternately arranged with the third pixel groups 530 in the horizontal direction may include white pixels having a white color filter.

The two or more pixels 511, 521, and 531 in each of the plurality of pixel groups 510, 520, and 530 may be arranged in a 2×2 form. For example, in some example embodiments, each pixel group 510, 520, and 530 may include four pixels arranged in a 2×2 form. Each of the pixels 511, 521, and 531 may be implemented as one of the pixels with reference to FIGS. 3 to 13. For example, when each of the pixels 511, 521, and 531 is implemented as the pixel 200 illustrated in FIGS. 6-8, each of the pixels 511, 521, and 531 may include a floating diffusion region, a transfer gate structure, and a transistor.

In the example in which each of the pixels 511, 521, and 531 is implemented as the pixel 200 illustrated in FIGS. 6-8, since each of the pixels 511, 521, and 531 includes only a single transistor 220, the pixels 511, 521, and 531 disposed in the 2×2 form in the plurality of pixel groups 510, 520, and 530, respectively, may share transistors to implement a pixel circuit. For example, since as illustrated in FIG. 14 four pixels 511, 521, and 531 are provided in each corresponding pixel group 510, 520, and 530 and thus four transistors 220 are disposed in each of the plurality of pixel groups 510, 520, and 530, two of the four transistors 220 may be allocated as driver transistors, and the other two transistors 220 may be selected as a reset transistor and a reset transistor, respectively, such that a pixel circuit may be implemented. Two transistors allocated as driver transistors may be connected in parallel to each other. A method of implementing a pixel circuit by sharing the transistors will be described later.

Thereafter, referring to FIG. 15, a pixel array 600 of an image sensor in an example embodiment may include a plurality of pixel regions 610, 620, and 630 arranged in a horizontal direction (e.g., the first direction, the X-axis direction) and a vertical direction (e.g., the second direction, the Y-axis direction). In the example embodiment in FIG. 15, each of the plurality of pixels 610, 620, and 630 may include two or more pixels 611, 621, and 631 adjacent to each other in at least one of the horizontal direction and the vertical direction. Similarly to the example embodiment described with reference to FIG. 14, in each of the plurality of pixel groups 610, 620, and 630, two or more pixels 611, 621, and 631 may include a color filter of the same color.

For example, in each of the first pixel groups 610, a plurality of red pixels 611 having a red color filter may be arranged in a 3×3 form, and in each of the second pixel groups 620, a plurality of green pixels 621 having a green color filter may be arranged in a 3×3 form. In each of the third pixel groups 630, a plurality of blue pixels 631 having a blue color filter may be arranged in a 3×3 form. However, the color of the color filter may be varied in example embodiments.

Each of the pixels 611, 621, and 631 may be implemented as a pixel described with reference to FIGS. 3 to 13. For example, when each of the pixels 611, 621, and 631 is implemented as the pixel 200 illustrated in FIGS. 6-8, each of the pixels 611, 621, and 631 may include a floating diffusion region, a transfer gate structure, and a transistor.

In the above example in which each of the pixels 611, 621, and 631 is implemented as the pixel 200 illustrated in FIGS. 6-8, since each of the pixels 611, 621, and 631 includes only a single transistor 220, the pixels 611, 621, and 631 arranged in the 3×3 form in each of the plurality of pixel groups 610, 620, and 630 may share transistors 220 to implement a pixel circuit. For example, as illustrated in FIG. 15 nine pixels 611, 621, and 631 are provided in each corresponding pixel group 610, 620, and 630 and thus since nine transistors 220 are disposed in each of the plurality of pixel groups 610, 620, and 630, a pixel circuit may be implemented by appropriately allocating the nine transistors to reset transistors, driver transistors, and select transistors. In an example embodiment, the number of transistors allocated to the driver transistors among the nine transistors may be the largest as compared with the number of transistors allocated to the reset and select transistors.

Figure 16:
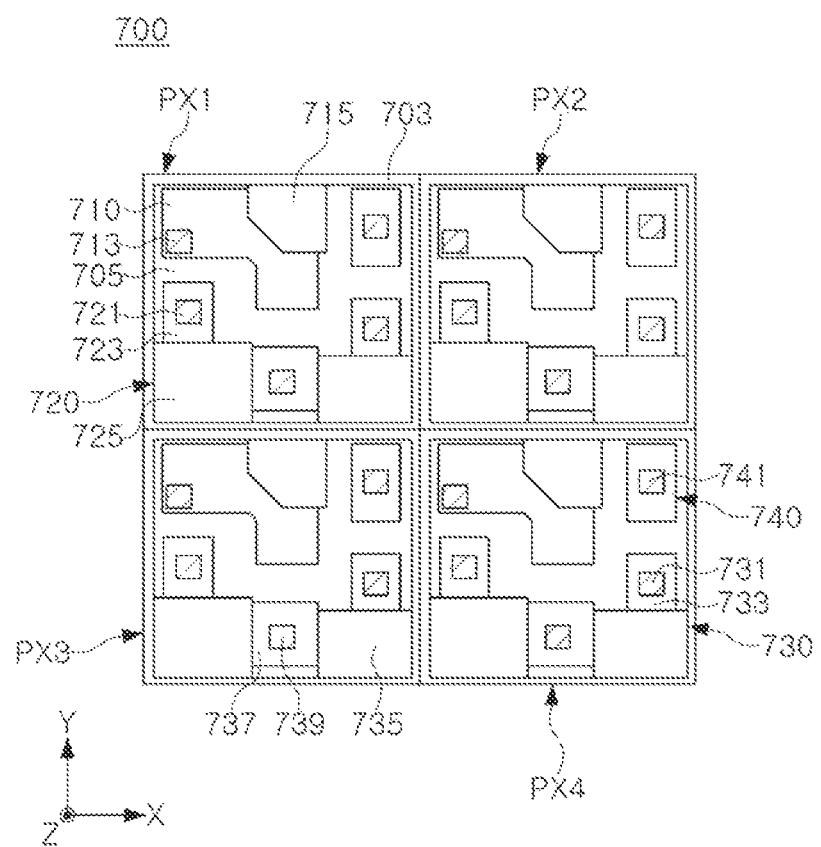
FIGS. 16 and 17 are pixels groups of the pixel array of FIG. 14 according to various example embodiments.
Figure 17:
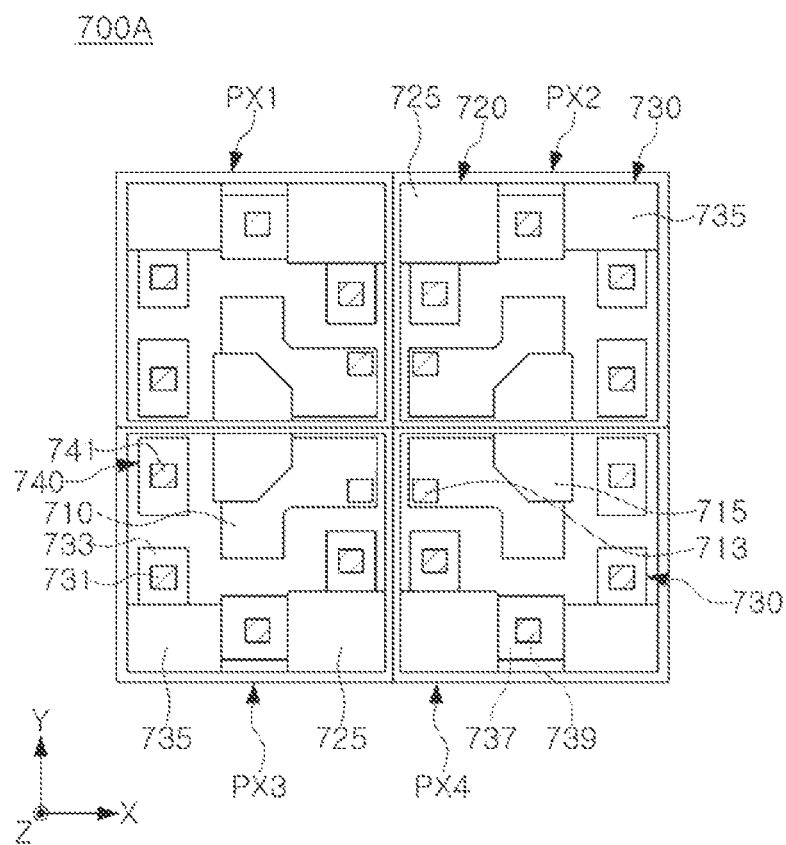

FIGS. 16 and 17 are pixels of an image sensor according to an example embodiment.

As an example, FIGS. 16 and 17 are diagrams illustrating one of the pixel groups illustrated in FIG. 14 according to the example embodiment. Referring to FIGS. 16 and 17, in the pixel groups 700 and 700A of the image sensor, a first pixel PX1, a second pixel PX2, a third pixel PX3, and a fourth pixel PX4 disposed in a 2×2 form in the horizontal direction (X-axis direction) and the vertical direction (Y-axis direction) may provide a single pixel group. The first to fourth pixels PX1-PX4 included in a single pixel group may include the same color filter, and each of the first to fourth pixels PX1-PX4 may include a microlens.

Each of the first to fourth pixels PX1-PX4 may be similar to the pixel 100 described with respect to FIGS. 3-5 and may include a floating diffusion region 710, a transfer gate structure 715, a first transistor 720 and a second transistor 730, and an impurity region 740. A floating diffusion contact 713 may be connected to the floating diffusion region 710, and a ground contact 741 may be connected to the impurity region 740 and a ground voltage may be input to the ground contact 741. The first transistor 720 and the second transistor 730 may share an active region 737. The first transistor 720 may include a first gate structure 725 and active regions 723 and 737 disposed on sides of the first gate structure 725, and the second transistor 730 may include a second gate structure 735, and active regions 733 and 737 disposed on sides of the second gate structure 735, as illustrated in FIG. 16. Active contacts 721, 731, and 739 may be connected to the active regions 723, 733, and 737, respectively.

The floating diffusion region 710, the active regions 723, 733, 737, and the impurity region 740 may be doped with impurities of the same conductivity type. The floating diffusion region 710 may have an area larger than the area of each of the active regions 723, 733, 737, respectively, and the floating diffusion region 710 may have an area larger than the area of the impurity region 740, to sufficiently store electric charges.

In the example embodiment illustrated in FIG. 16, the first to fourth pixels PX1-PX4 may be disposed in the same form. In other words, each of the first to fourth pixels PX1-PX4 may have a same structure. By contrast, in the example embodiment illustrated in FIG. 17, the first to fourth pixels PX1-PX4 may be disposed in different forms. Referring to FIG. 17, the first pixel PX1 and the second pixel PX2 may be disposed to be symmetric with reference to a Y-axis, the first pixel PX1 and the third pixel PX3 may be disposed to be symmetric with reference to an X-axis, the fourth pixel PX4 and the second pixel PX2 may be disposed to be symmetric with reference to the X-axis, and the fourth pixel PX4 and the third pixel PX3 may be disposed to be symmetric with reference to the Y-axis.

In the example embodiment illustrated in FIG. 17, the four floating diffusion regions 710 included in the first to fourth pixels PX1-PX4 may be arranged in the center of the pixel group 700A. Accordingly, in implementing a single pixel circuit using the eight transistors included in the first to fourth pixels PX1-PX4, wiring patterns connecting the floating diffusion regions 710 to each other may be efficiently disposed and by reducing resistor components, performance of the image sensor may improve. For example, the floating diffusion contacts 713 connected to the floating diffusion regions 710 may be connected to each other by one or more wiring patterns, and accordingly, the first to fourth pixels PX1-PX4 may provide a single floating diffusion region in a single pixel group in terms of circuit.

Figure 18:
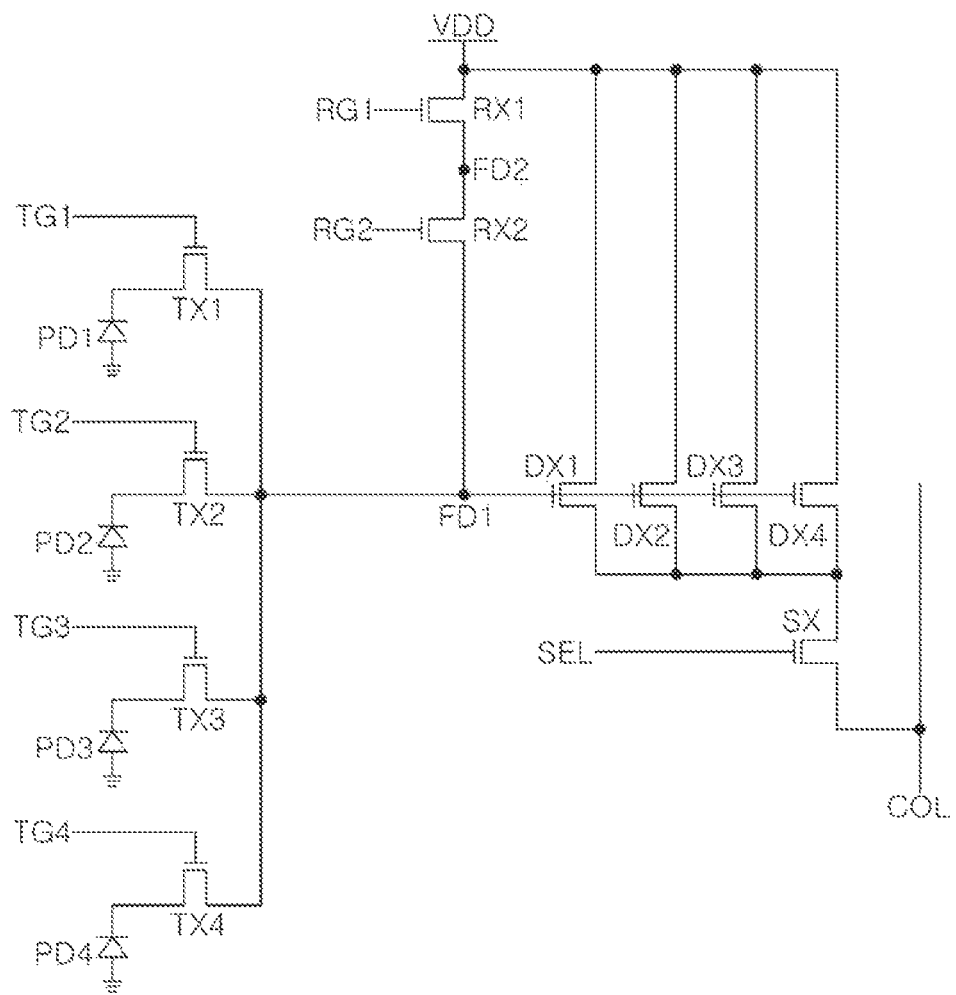
FIG. 18 is a circuit diagram illustrating a pixel circuit of the pixels illustrated in FIGS. 16 and 17 according to an example embodiment.

Hereinafter, a method of implementing a pixel circuit in a pixel group according to the example embodiments illustrated in FIGS. 16 and 17 will be described with reference to FIG. 18 is a circuit diagram illustrating the pixel circuit illustrated in FIGS. 16 and 17 according to an example embodiment.

FIG. 18 is a circuit diagram illustrating a pixel circuit including four photodiodes and four transfer gate structures 715 included in the pixel group 700 or 700A illustrated in FIG. 16 or 17, four floating diffusion regions 710, and eight transistors 720 and 730. Hereinafter, the configuration of the pixel circuit will be described with reference to FIGS. 16 and 17 together.

Referring to FIG. 18, the first photodiode PD1 of the first pixel PX1 and the first transfer transistor TX1 may be connected to the first floating diffusion node FD1. Similarly, the second to fourth photodiodes PD2-PD4 of the second to fourth pixels PX2-PX4 may be connected to the first floating diffusion node FD1 through the second to fourth transfer transistors TX2-TX4. The first floating diffusion node FD1 may be implemented by connecting the floating diffusion regions 710 included in each of the first to fourth pixels PX1-PX4 by a wiring pattern. Each of the first to fourth transfer transistors TX1 to TX4 may be implemented by a transfer gate structure 715 of each of the first to fourth pixels PX1-PX4 and may be turned on or turned off by each of the first to fourth transfer control signals TG1-TG4 input to the transfer gate structure 715.

The pixel circuit may include first and second reset transistors RX1 and RX2, first to fourth driver transistors DX1-DX4, and a select transistor SX. The first and second reset transistors RX1 and RX2 may be connected to each other in series, and a second floating diffusion node FD2 may be defined therebetween. The first and second reset transistors RX1 and RX2 may be controlled by the first and second reset control signals RG1 and RG2, respectively.

For example, four of the eight transistors included in the first to fourth pixels PX1-PX4 may be connected to each other in parallel and may provide the first to fourth driver transistors DX1 to DX4, and two transistors may be connected to each other in series and may provide the first and second reset transistors RX1 and RX2. One of the other two transistors may be provided as the select transistor SX, and the other transistor may be configured to provide the second floating diffusion node FD2.

The second floating diffusion node FD2 may be connected to the first floating diffusion node FD1 when the second reset transistor RG2 is turned on. Accordingly, a conversion gain of the image sensor may be adjusted using the second floating diffusion node FD2 and the second reset transistor RG2. For example, the logic circuit of the image sensor may reduce the conversion gain by connecting the first floating diffusion node FD1 to the second floating diffusion node FD2 by turning on the second reset transistor RG2. Alternatively, the logic circuit may increase the conversion gain by turning off the second reset transistor RG2.

However, the pixel circuit described with reference to FIG. 18 is merely an example, and example embodiments are not limited thereto. By configuring the wiring patterns included in the first to fourth pixels PX1-PX4 differently, a pixel circuit having a structure different from that of the example in FIG. 18 may be implemented using eight transistors.

Figure 19:
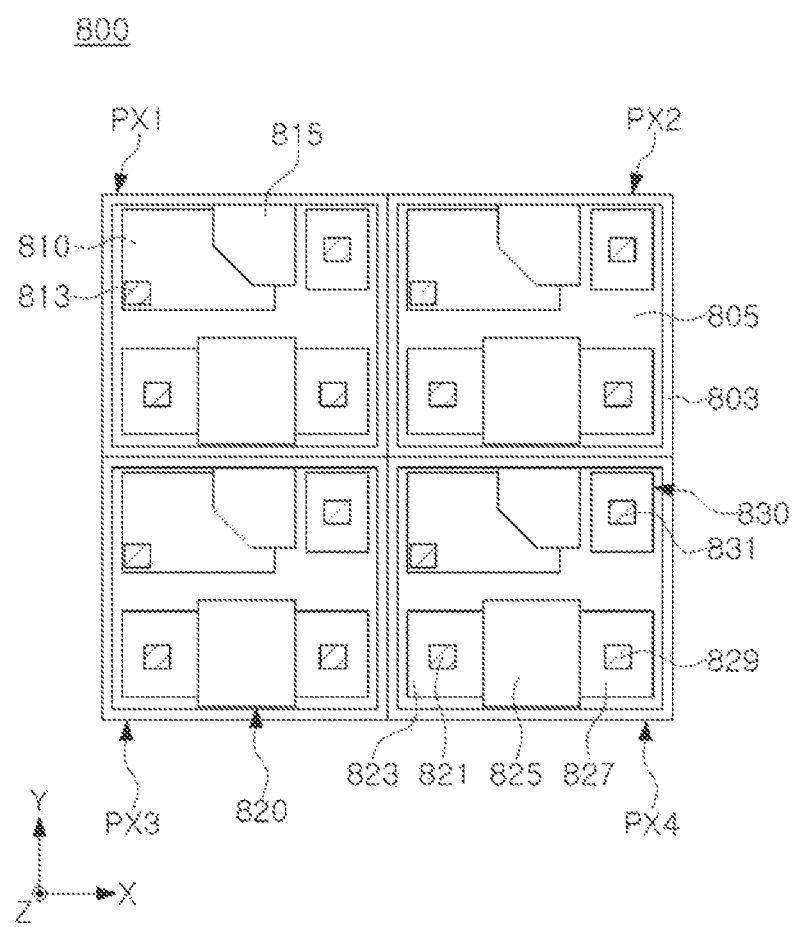
FIGS. 19 and 20 are diagrams illustrating pixels groups of the pixel array of FIG. 14 according to various example embodiments.
Figure 20:
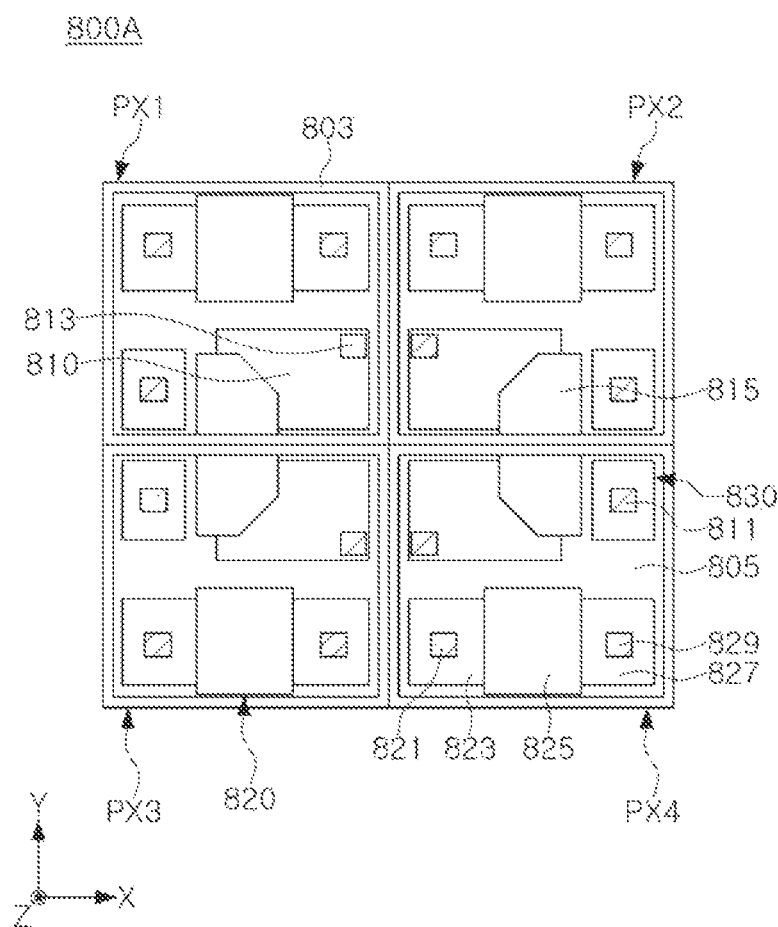

FIGS. 19 and 20 are diagrams illustrating pixels of an image sensor according to an example embodiment.

For example, FIGS. 19 and 20 are diagrams illustrating one of the pixel groups illustrated in FIG. 14 according to the example embodiment. Referring to FIGS. 19 and 20, in the pixel groups 800 and 800A of the image sensor, first to fourth pixels PX1-PX4 disposed in a 2×2 form in the horizontal direction (X-axis direction) and the vertical direction (Y-axis direction) may provide a single pixel group 800 or 800A.

Each of the first to fourth pixels PX1-PX4 may be similar to the pixel 200 described with respect to FIGS. 6-8 and may include a floating diffusion region 810, a transfer gate structure 815, a transistor 820, and an impurity region 830. A floating diffusion contact 813 may be connected to the floating diffusion region 810, and a ground contact 831 may be connected to the impurity region 830 and a ground voltage may be input. In the example embodiments in FIGS. 19 and 20, each of the first to fourth pixels PX1-PX4 may include only a single transistor 820, and the transistor 820 may include a gate structure 815, and active regions 823 and 827. Active contacts 821 and 829 may be connected to the active regions 823 and 827, respectively.

The floating diffusion region 810, the active regions 823 and 827, and the impurity region 830 may be doped with impurities of the same conductivity type. The floating diffusion region 810 may have an area larger than the area of each of the active regions 823 and 827 and the floating diffusion region 810 may have an area larger than the area of the impurity region 830, to sufficiently store electric charges. An area of the transfer gate structure 815 may be smaller than an area of the gate structure 825.

In the example embodiment illustrated in FIG. 19, the first to fourth pixels PX1-PX4 may be disposed in the same form. In other words, each of the first to fourth pixels PX1-PX4 may have a same structure. By contrast, in the example embodiment illustrated in FIG. 20, the first to fourth pixels PX1-PX4 may be disposed in different forms. Referring to FIG. 20, the first to fourth pixels PX1-PX4 may be disposed such that the floating diffusion region 810 included in the first to fourth pixels PX1-PX4 may be in the center of the pixel group. Accordingly, a wiring pattern connecting the four floating diffusion regions 810 included in the pixel group to each other may be efficiently disposed.

Hereinafter, a method of implementing a pixel circuit in a pixel group according to the example embodiments illustrated in FIGS. 19 and 20 will be described with reference to FIG. 21.

Figure 21:
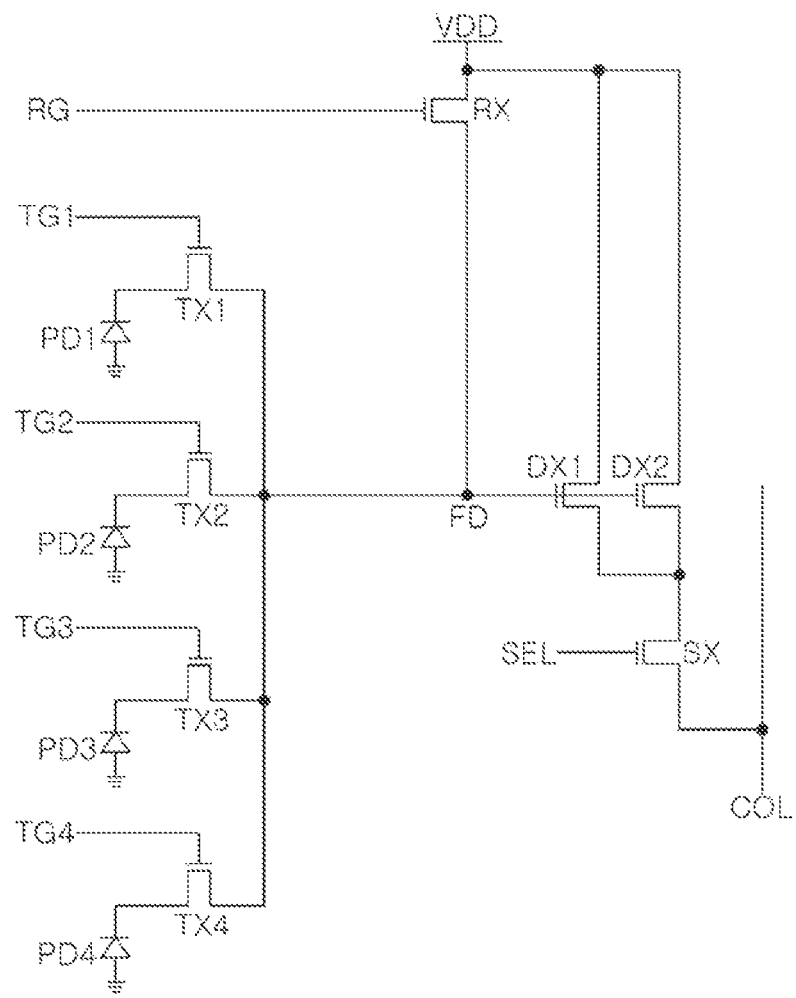
FIG. 21 is a circuit diagram illustrating a pixel circuit of the pixels illustrated in FIGS. 19 and 20 according to an example embodiment.

FIG. 21 is a circuit diagram illustrating the pixel circuit illustrated in FIGS. 19 and 20 according to an example embodiment.

FIG. 21 may be a circuit diagram illustrating a pixel circuit including four photodiodes and four transfer gate structures 815 included in the pixel group 800 or 800A illustrated in FIG. 19 or 20, four floating diffusion regions 810, and four transistors 820. Hereinafter, the configuration of the pixel circuit will be described with reference to FIGS. 19 and 20 together.

Referring to FIG. 21, the first photodiode PD1 and the first transfer transistor TX1 of the first pixel PX1 may be connected to the first floating diffusion node FD1. Similarly, the second to fourth photodiodes PD2-PD4 of the second to fourth pixels PX2-PX4 may be connected to the floating diffusion node FD through the second to fourth transfer transistors TX2-TX4. The floating diffusion node FD may be implemented by connecting the floating diffusion regions 810 included in each of the first to fourth pixels PX1-PX4 to each other using a wiring pattern. Each of the first to fourth transfer transistors TX1 to TX4 may be implemented by a transfer gate structure 815 of each of the first to fourth pixels PX1-PX4 and may be turned on or turned off by each of the fourth transfer control signals TG1-TG4 input to the transfer gate structure 815.

The pixel circuit may include a reset transistor RX, first and second driver transistors DX1 and DX2, and a select transistor SX. The reset transistor RX may be controlled by the reset control signal RG, and the select transistor SX may be controlled by the selection control signal SEL. For example, two of the four transistors included in the first to fourth pixels PX1-PX4 may be connected to each other in parallel and may provide the first and second driver transistors DX1 and DX2, and the one of the two transistors may be provided as the select transistor SX, and the other transistor may be configured to provide the reset transistor RX.

However, the pixel circuit described with reference to FIG. 18 is merely an example, and example embodiments are not limited thereto. By configuring the wiring patterns included in the first to fourth pixels PX1-PX4 differently, a pixel circuit having a structure different from the example in FIG. 21 may be implemented using four transistors. For example, one of the four transistors may be allocated as a driver transistor and the other one of the transistor may be allocated as a select transistor. Also, by connecting the other two transistors to each other in series and allocating the transistors to the first and second reset transistors, an image sensor which may adjust a conversion gain of a pixel may be implemented.

Figure 22:
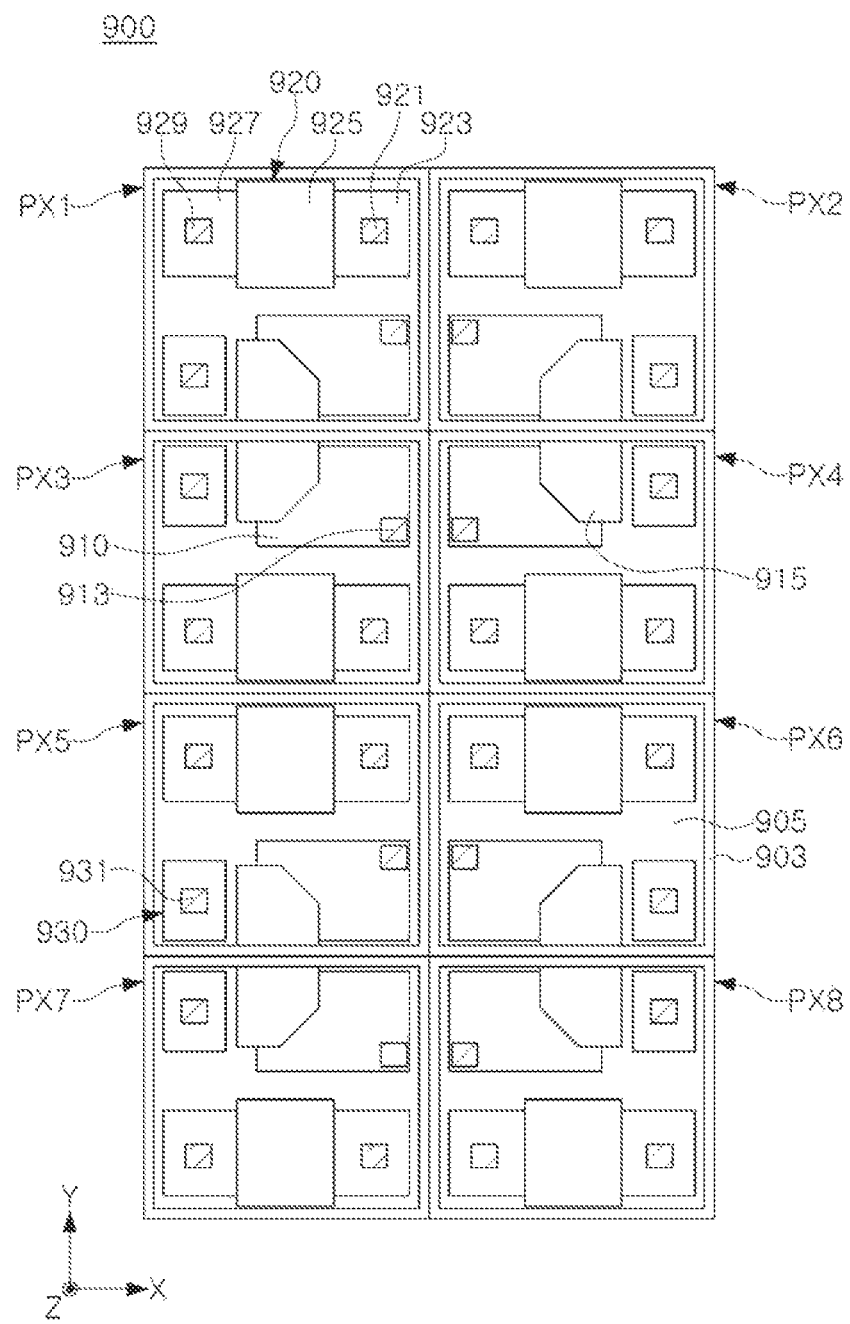
FIG. 22 is a diagram illustrating pixels of an image sensor according to an example embodiment.

FIG. 22 is a diagram illustrating pixels of a pixel group according to an example embodiment.

For example, FIG. 22 may be a diagram illustrating one of the pixel groups included in a pixel array of an image sensor according to an example embodiment. Referring to FIG. 22, in a pixel group 900 of the image sensor, the first to eighth pixels PX1 to PX8 arranged in a 4×2 form in the horizontal direction (X-axis direction) and the vertical direction (Y-axis direction) may provide a single pixel group 900. For example, each of the first to eighth pixels PX1 to PX8 may have a structure similar to the pixel 200 described with reference to FIGS. 6-8. Accordingly, each of the first to eighth pixels PX1 to PX8 may include a floating diffusion region 910, a transfer gate structure 915, a transistor 920, and an impurity region 930.

In the example embodiment illustrated in FIG. 22, the first to fourth pixels PX1-PX4 and the fifth to eighth pixels PX5 to PX8 may be disposed in the same form. In other words, each of the first to eighth pixels PX1-PX8 may have a same structure. Referring to FIG. 22, the first to fourth pixels PX1-PX4 may be disposed such that the floating diffusion regions 910 included in the first to fourth pixels PX1-PX4 may be adjacent to each other. Also, the fifth to eighth pixels PX5 to PX8 may be disposed such that the floating diffusion regions 910 included in the fifth to eighth pixels PX5 to PX8 may be adjacent to each other. Accordingly, a wiring pattern connecting the eight floating diffusion regions 910 included in the pixel group to each other may be efficiently disposed.

In the example embodiment in FIG. 22, each of the first to eighth pixels PX1 to PX8 may include only a single transistor 920, and thus eight transistors 920 may be disposed in a single pixel group 900. In an example embodiment, the eight transistors 820 included in the single pixel group 900 may provide two reset transistors RX1 and RX2, four driver transistors DX1-DX4, and a single select transistor SX and a second floating diffusion node FD2, as described with reference to FIG. 23. The eight photodiodes included in the single pixel group 900 may be connected to the first floating diffusion node FD1 through eight transfer transistors as described with reference to FIG. 23. The first floating diffusion node FD1 may be implemented by a wiring pattern connecting the eight floating diffusion regions 910 to each other.

Figure 23:
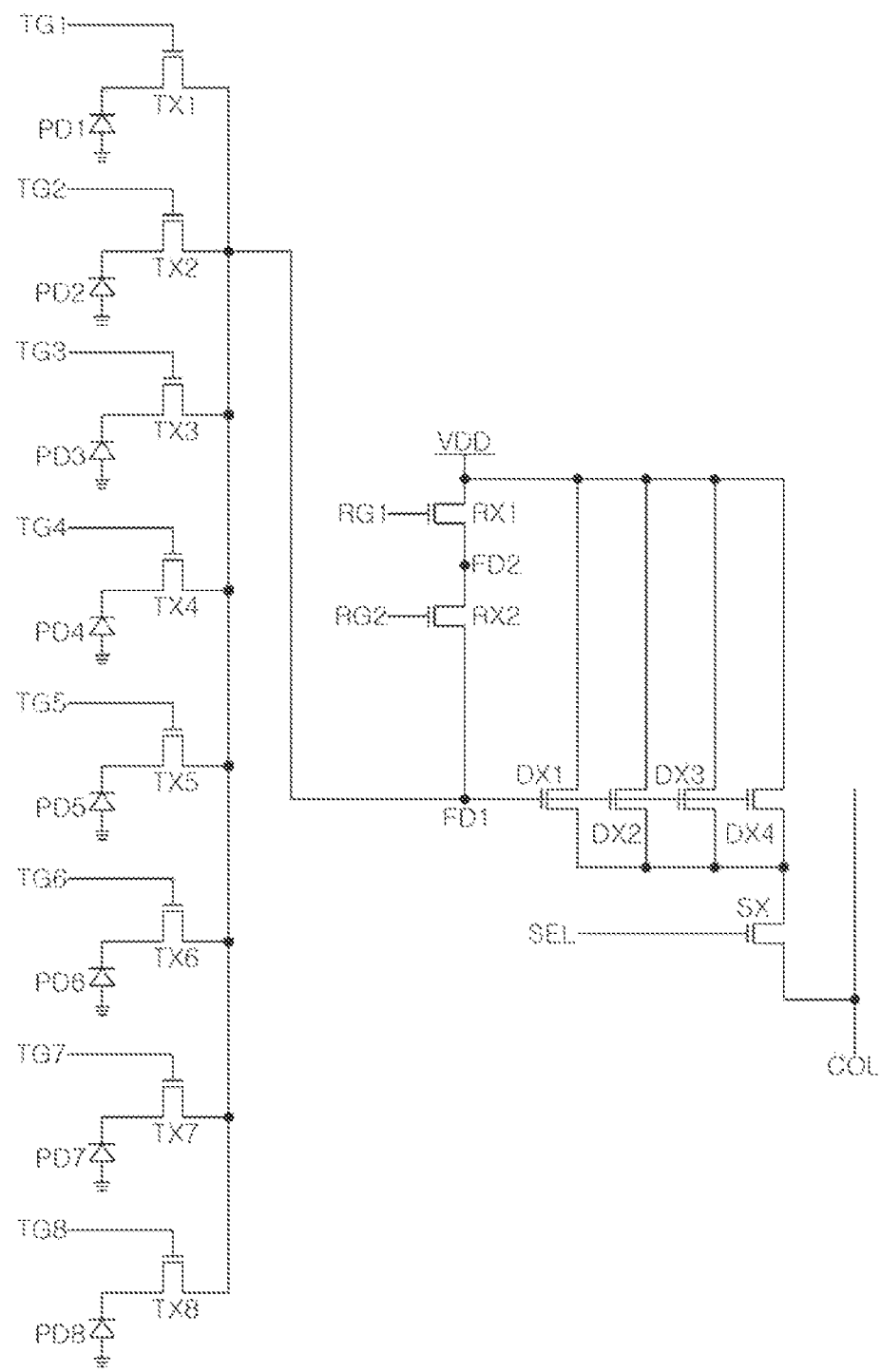
FIG. 23 is a circuit diagram illustrating a pixel circuit of the pixels illustrated in FIG. 22 according to an example embodiment.

FIG. 23 is a circuit diagram illustrating a pixel circuit illustrated in FIG. 22 according to an example embodiment.

FIG. 23 is a circuit diagram illustrating eight photodiodes, and eight transfer gate structures 915, eight floating diffusion regions 910 and eight transistors 920 included in the pixel group 900 illustrated in FIG. 22. Hereinafter, the configuration of the pixel circuit will be described with reference to FIG. 22.

Referring to FIG. 23, the first photodiode PD1 and the first transfer transistor TX1 of the first pixel PX1 may be connected to the first floating diffusion node FD1. Similarly, the second to eighth photodiodes PD2-PD8 of the second to eighth pixels PX2-PX8 may be connected to a first floating diffusion node FD1 through the second to eighth transfer transistors TX2-TX8. The first floating diffusion node FD1 may be implemented by connecting the floating diffusion regions 910 included in each of the first to eighth pixels PX1 to PX8 to each other using a wiring pattern. Each of the first to eighth transfer transistors TX1-TX8 may be implemented by a transfer gate structure 915.

The pixel circuit may include first and second reset transistors RX1 and RX2, first to fourth driver transistors DX1-DX4, and a select transistor SX. The first and second reset transistors RX1 and RX2 may be connected to each other in series, and a second floating diffusion node FD2 may be defined therebetween. The first and second reset transistors RX1 and RX2 may be controlled by the first and second reset control signals RG1 and RG2, respectively.

For example, four of the eight transistors included in the first to fourth pixels PX1-PX4 may be connected to each other in parallel and may provide the first to fourth driver transistors DX1 to DX4, and two of the transistors may be connected to each other in series and may provide the first and second reset transistors RX1 and RX2. The other two transistors may provide the select transistor SX and the second floating diffusion node FD2. By connecting the second floating diffusion node FD2 to the first floating diffusion node FD1 and disconnecting the second floating diffusion node FD2 form the first floating diffusion node FD1, the conversion gain of the image sensor may be changed.

According to various example embodiments, by arranging the elements providing the pixel circuit in each of the pixels, a leakage current may be reduced such that the dark level may be addressed, and white spots may be prevented in an image. Also, by reducing the size of each pixel, the number of pixels included in the pixel array may increase, and an image sensor which may generate a high-quality image may be implemented.

While various example embodiments have been illustrated and described above, it will be apparent to those skilled in the art that modifications and variations may be made without departing from the scope of the present disclosure as defined by the appended claims.

What is claimed is:

1. An image sensor comprising:
a plurality of pixels arranged parallel to an upper surface of a substrate; and
a pixel isolation film disposed between the plurality of pixels,
wherein each of the plurality of pixels includes at least one photodiode, a floating diffusion region doped with impurities of a first conductivity type, a transfer gate structure that is disposed adjacent to the floating diffusion region, and at least one transistor,
wherein the transfer gate structure includes a transfer gate electrode layer, a transfer gate insulating layer disposed between the transfer gate electrode layer and the substrate, and a transfer gate spacer adjacent to the transfer gate insulating layer in a first direction parallel to the upper surface of the substrate, and at least a portion of the transfer gate spacer is disposed between the floating diffusion region and the transfer gate electrode layer,
wherein, in each of the plurality of pixels, a floating diffusion contact connected to the floating diffusion region is disposed more adjacent in the first direction to the pixel isolation film than to the transfer gate structure, and
wherein the transfer gate spacer includes a first spacer region extending along a side surface of the transfer gate insulating layer, a second spacer region extending along a side surface of the floating diffusion region, and a valley region disposed between the first spacer region and the second spacer region.

2. The image sensor of claim 1, wherein the transfer gate structure is adjacent to the at least one photodiode in a vertical direction, and is adjacent to the floating diffusion region in the first direction.

3. The image sensor of claim 2,
wherein the floating diffusion region is disposed on a first side of the transfer gate structure in the first direction, and an impurity region is disposed on a second side of the transfer gate structure in the first direction, the second side being opposite to the first side in the first direction, and
wherein a ground voltage is input to the impurity region.

4. The image sensor of claim 3, wherein an element isolation film is disposed between the transfer gate structure and the impurity region.

5. The image sensor of claim 3,
wherein a ground contact is connected to the impurity region, and
wherein, in the first direction, a first distance between the floating diffusion contact and the pixel isolation film that is adjacent to the floating diffusion region is less than a second distance between the ground contact and the pixel isolation film that is adjacent to the impurity region.

6. The image sensor of claim 5,
wherein the at least one transistor includes a gate structure, and a first active region and a second active region disposed on opposite sides of the gate structure, and
wherein a first active contact that is connected to the first active region is offset in the first direction from the floating diffusion contact.

7. The image sensor of claim 6, wherein a second active contact that is connected to the second active region is offset in the first direction from the ground contact.

8. The image sensor of claim 6, wherein an area of the floating diffusion region is greater than an area of the first active region, and the area of the floating diffusion region is greater than an area of the second active region.

9. The image sensor of claim 1, wherein a length of the second spacer region in a vertical direction is less than a length of the first spacer region in the vertical direction.

10. The image sensor of claim 9, wherein the length of the second spacer region is less than a depth of the floating diffusion region in the vertical direction.

11. The image sensor of claim 1,
wherein the floating diffusion region includes a first floating diffusion region having a first impurity concentration and a second floating diffusion region having a second impurity concentration higher than the first impurity concentration, and
wherein the first floating diffusion region is disposed between the second floating diffusion region and the transfer gate structure.

12. The image sensor of claim 1, wherein
the transistors included in two or more adjacent pixels of the plurality of pixels that are adjacent to each other are connected to the photodiodes included in the two or more adjacent pixels, and the transistors and the photodiodes provide a single pixel circuit.

13. The image sensor of claim 12, wherein each of the plurality of pixels includes a color filter disposed above the at least one photodiode, and
color filters included in the two or more adjacent pixels have a same color.

14. The image sensor of claim 12, wherein each of the plurality of pixels includes a color filter disposed above the at least one photodiode, and at least a portion of color filters included in the two or more adjacent pixels have different colors.

15. An image sensor comprising:
a pixel array including a plurality of pixels arranged in parallel to an upper surface of a substrate and a pixel isolation film disposed between the plurality of pixels, each of the plurality of pixels including at least one photodiode, a color filter disposed above the at least one photodiode, and elements disposed below the at least one photodiode; and
a logic circuit configured to obtain a pixel signal from the plurality of pixels,
wherein the elements include a floating diffusion region doped with impurities of a first conductivity type, a transfer gate structure adjacent to the floating diffusion region, and a transistor,
wherein, in each of the plurality of pixels, the transistor is spaced apart from the floating diffusion region and from the transfer gate structure,
wherein the transistor includes a gate structure, a first active region adjacent to the gate structure, and a second active region adjacent to the gate structure,
wherein a shortest distance between a floating diffusion contact connected to the floating diffusion region and the pixel isolation film is less than a shortest distance between a first active contact connected to the first active region and the pixel isolation film, and
wherein the transfer gate spacer includes a first spacer region extending along a side surface of the transfer gate insulating layer, a second spacer region extending along a side surface of the floating diffusion region, and a valley region disposed between the first spacer region and the second spacer region.

16. The image sensor of claim 15, wherein a shortest distance between the transfer gate structure and the floating diffusion contact is longer than a shortest distance between the first active contact and the gate structure of the transistor.

17. An image sensor comprising:
a pixel array including a plurality of pixels arranged parallel to an upper surface of a substrate, each of the plurality of pixels including at least one photodiode, a color filter disposed on the at least one photodiode, and at least one element disposed below the at least one photodiode; and
a logic circuit configured to obtain a pixel signal from the plurality of pixels,
wherein each of the plurality of pixels includes a plurality of active regions and a floating diffusion region, each of the plurality of active regions and the floating diffusion region being doped with impurities of a same conductivity type, an element isolation film disposed between the plurality of active regions and the floating diffusion region,
wherein a shortest distance between the element isolation film and a floating diffusion contact that is connected to the floating diffusion region is less than a shortest distance between the element isolation film and a plurality of active contacts respectively connected to the plurality of active regions, and
wherein an area of the floating diffusion region is greater than an area of each of the plurality of active regions.

18. The image sensor of claim 17,
wherein the plurality of active contacts are disposed in centers respectively of the plurality of active regions, and
wherein the floating diffusion contact is disposed adjacent to one of boundaries of the floating diffusion region.

19. The image sensor of claim 17,
wherein each of the plurality of pixels includes a transfer gate structure adjacent to the floating diffusion region and a gate structure adjacent to at least a portion of the plurality of active regions, and
wherein an area of the transfer gate structure is smaller than an area of the gate structure.

\* \* \* \* \*